United States Patent
Fukuhara et al.

(10) Patent No.: US 11,480,876 B2
(45) Date of Patent: Oct. 25, 2022

(54) PHOTOSENSITIVE RESIN COMPOSITION, CURED FILM, LAMINATE, METHOD FOR PRODUCING CURED FILM, AND SEMICONDUCTOR DEVICE

(71) Applicant: FUJIFILM Corporation, Tokyo (JP)

(72) Inventors: Kei Fukuhara, Haibara-gun (JP); Yu Iwai, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 124 days.

(21) Appl. No.: 16/580,262

(22) Filed: Sep. 24, 2019

(65) Prior Publication Data

US 2020/0019057 A1 Jan. 16, 2020

Related U.S. Application Data

(63) Continuation of application No. PCT/JP2018/012140, filed on Mar. 26, 2018.

(30) Foreign Application Priority Data

Mar. 29, 2017 (JP) .............................. JP2017-064465

(51) Int. Cl.
| | |
|---|---|
| *G03F 7/037* | (2006.01) |
| *G03F 7/038* | (2006.01) |
| *G03F 7/30* | (2006.01) |
| *C08G 73/10* | (2006.01) |
| *G03F 7/031* | (2006.01) |
| *G03F 7/16* | (2006.01) |
| *G03F 7/20* | (2006.01) |
| *G03F 7/32* | (2006.01) |
| *H01L 23/532* | (2006.01) |

(52) U.S. Cl.
CPC ......... *G03F 7/037* (2013.01); *C08G 73/1071* (2013.01); *G03F 7/031* (2013.01); *G03F 7/0387* (2013.01); *G03F 7/162* (2013.01); *G03F 7/168* (2013.01); *G03F 7/2004* (2013.01); *G03F 7/325* (2013.01); *H01L 23/5329* (2013.01)

(58) Field of Classification Search
CPC ........... G03F 7/037; G03F 7/0388; G03F 7/30
See application file for complete search history.

(56) References Cited

U.S. PATENT DOCUMENTS

| | | | | |
|---|---|---|---|---|
| 5,614,354 A | * | 3/1997 | Eguchi | G03F 7/039 430/326 |
| 6,541,178 B2 | * | 4/2003 | Jung | C07C 309/43 430/270.1 |
| 7,282,323 B2 | * | 10/2007 | Kanatani | G03F 7/035 430/18 |
| 2010/0260983 A1 | | 10/2010 | Minegishi et al. | |
| 2011/0083884 A1 | * | 4/2011 | Okada | C08G 73/1042 174/256 |

FOREIGN PATENT DOCUMENTS

| | | |
|---|---|---|
| JP | 2001-194783 A | 7/2001 |
| JP | 2001-254014 A | 9/2001 |
| JP | 2003-345012 A | 12/2003 |
| JP | 2009-230098 A | 10/2009 |
| JP | 2009-251451 A | 10/2009 |
| JP | 2010-009052 A | 1/2010 |
| JP | 2010-266843 A | 11/2010 |
| JP | 2011-59656 A | 3/2011 |
| JP | 2011-164454 A | 8/2011 |
| JP | 2014-122279 A | 7/2014 |
| JP | 2014-145957 A | 8/2014 |
| JP | 2015-113429 A | 6/2015 |
| JP | 2015-127817 A | 7/2015 |
| JP | 2015-151405 A | 8/2015 |
| JP | 2016-167036 A | 9/2016 |
| TW | 201546119 A | 12/2015 |
| WO | 2015/011893 A1 | 1/2015 |
| WO | 2017/033833 A1 | 3/2017 |
| WO | 2017/038598 A1 | 3/2017 |

OTHER PUBLICATIONS

International Search Report dated Jun. 12, 2018 in International Application No. PCT/JP2018/012140.
Written Opinion of the International Searching Authority dated Jun. 12, 2018 in International Application No. PCT/JP2018/012140.
International Preliminary Report on Patentability (IPRP) dated Oct. 1, 2019 in International Application No. PCT/JP2018/012140.
Office Action dated Dec. 1, 2020 by the Korean Intellectual Property Office in Korean application No. 10-2019-7028207.
Office Action dated Jun. 3, 2021, from the Taiwanese Intellectual Property Office in Taiwanese application No. 107110173.
Office Action dated Jul. 7, 2020 from the Japanese Patent Office in JP Application No. 2019-509806.

* cited by examiner

*Primary Examiner* — John S Chu
(74) *Attorney, Agent, or Firm* — Sughrue Mion, PLLC

(57) ABSTRACT

Provided are a photosensitive resin composition in which warping of a cured film after curing is decreased and lithographic properties in a case of forming a pattern are excellent, a cured film, a laminate, a method for producing a cured film, and a semiconductor device. The photosensitive resin composition includes a polyimide precursor including a repeating unit including a biphenyl structure and a photopolymerization initiator having an oxime structure capable of generating an aryl radical by being irradiated with light.

21 Claims, No Drawings

PHOTOSENSITIVE RESIN COMPOSITION, CURED FILM, LAMINATE, METHOD FOR PRODUCING CURED FILM, AND SEMICONDUCTOR DEVICE

CROSS-REFERENCE TO RELATED APPLICATIONS

This application is a Continuation of PCT International Application No. PCT/JP2018/012140 filed on Mar. 26, 2018, which claims priority under 35 U.S.C § 119(a) to Japanese Patent Application No. 2017-064465 filed on Mar. 29, 2017. Each of the above application(s) is hereby expressly incorporated by reference, in its entirety, into the present application.

BACKGROUND OF THE INVENTION

1. Field of the Invention

The present invention relates to a photosensitive resin composition, a cured film, a laminate, a method for producing a cured film, and a semiconductor device.

2. Description of the Related Art

A polyimide resin is known for a material used for a surface protective film or an interlayer insulating film of a semiconductor element. The polyimide resin is generally provided in a form of a polyimide precursor.

For example, JP2009-230098A discloses a photosensitive resin composition including: 100 parts by mass of a polyimide precursor (A) having a repeating unit represented in General Formula (1)

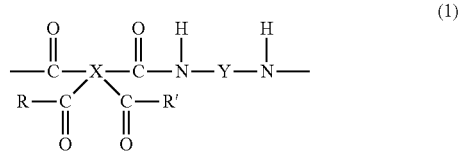

{in formula, X is a tetravalent organic group having 6 to 32 carbon atoms, Y is a divalent organic group having 4 to 30 carbon atoms, and R and R' each independently represent a monovalent organic group having an olefinic double bond or a hydroxyl group}; and
a predetermined additive.

SUMMARY OF THE INVENTION

However, the present inventors have carried out studies and found that a cured film which is obtained after curing the photosensitive resin composition described in JP2009-230098A may be warped or decreased in lithographic properties in a case of forming a pattern.

An object of the present invention is to solve the problems and to provide a photosensitive resin composition in which warping of a cured film after curing is decreased and lithographic properties in a case of forming a pattern are excellent, a cured film, a laminate, a method for producing a cured film, and a semiconductor device.

Considering the above-mentioned problems, the present inventors have carried out studies, and as a result, found that the above problems can be solved by using a polyimide precursor including a biphenyl structure as a polyimide precursor and using a photopolymerization initiator having an oxime structure capable of generating an aryl radical by being irradiated with light. Specifically, the above problems have been solved by following means <1>, and preferably <2> to <25>.

<1> A photosensitive resin composition comprising:
a polyimide precursor including a repeating unit including a biphenyl structure; and
a photopolymerization initiator having an oxime structure capable of generating an aryl radical by being irradiated with light.

<2> The photosensitive resin composition according to <1>, in which the polyimide precursor further includes a repeating unit including a biphenyloxy structure.

<3> The photosensitive resin composition according to <2>, in which a molar ratio of the repeating unit including a biphenyl structure to the repeating unit including a biphenyloxy structure is 30:70 to 70:30.

<4> The photosensitive resin composition according to <2> or <3>, in which the repeating unit including a biphenyl structure and the repeating unit including a biphenyloxy structure each independently include a structure derived from a tetracarboxylic acid.

<5> The photosensitive resin composition according to any one of <1> to <4>, further comprising:
a (meth)acrylate including -(alkyl chain-O)$_4$— structure;
a (meth)acrylate including -(alkyl chain-O)$_5$— structure; and
a (meth)acrylate including -(alkyl chain-O)$_6$— structure.

<6> The photosensitive resin composition according to <5>, in which the alkyl chain is an ethylene chain.

<7> The photosensitive resin composition according to <5> or <6>, in which the (meth)acrylate is a bi- or higher-functional (meth)acrylate.

<8> The photosensitive resin composition according to any one of <1> to <7>, further comprising 10 to 500 mass ppm of a urea compound with respect to 100 parts by mass of the polyimide precursor.

<9> The photosensitive resin composition according to any one of <1> to <8>, in which a weight-average molecular weight of the polyimide precursor is 10000 to 25000.

<10> The photosensitive resin composition according to any one of <1> to <9>, in which a molecular weight dispersion of the polyimide precursor is 1.3 to 2.0.

<11> The photosensitive resin composition according to any one of <1> to <10>, in which a ring closure rate calculated from an NH signal of nuclear magnetic resonance spectrum of the polyimide precursor is 20% to 30%.

<12> The photosensitive resin composition according to any one of <1> to <11>, in which the repeating unit including a biphenyl structure is represented by Formula (1), Formula (1)

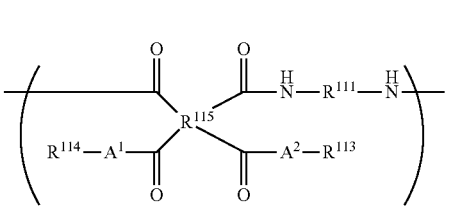

In Formula (1), $A^1$ and $A^2$ each independently represent an oxygen atom or NH, $R^{111}$ represents a divalent organic group, $R^{115}$ represents a tetravalent organic group having a biphenyl skeleton, and $R^{113}$ and $R^{114}$ each independently represent a group including a radically polymerizable group.

<13> The photosensitive resin composition according to <12>, in which the repeating unit including a biphenyloxy structure is represented by Formula (2),

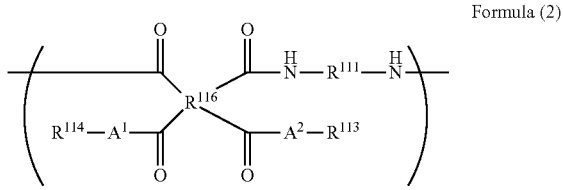

Formula (2)

in Formula (2), $A^1$ and $A^2$ each independently represent an oxygen atom or NH, $R^{111}$ represents a divalent organic group, $R^{116}$ represents a tetravalent organic group having a biphenyloxy skeleton, and $R^{113}$ and $R^{114}$ each independently represent a group including a radically polymerizable group.

<14> The photosensitive resin composition according to <13>, in which $R^{111}$ in Formula (1) and $R^{111}$ in Formula (2) are each independently represented by —Ar-L-Ar—, where Ar's each independently represent an aromatic hydrocarbon group, and L is a group selected from the group consisting of an aliphatic hydrocarbon group having 1 to 10 carbon atoms which may be substituted with a fluorine atom, —O—, —CO—, —S—, —$SO_2$—, —NHCO—, and a group obtained by combining two or more thereof.

<15> The photosensitive resin composition according to any one of <1> to <14>, further comprising a solvent.

<16> The photosensitive resin composition according to any one of <1> to <15>, in which the photosensitive resin composition is used for a negative tone development.

<17> The photosensitive resin composition according to any one of <1> to <16>, in which the photosensitive resin composition is used for forming an interlayer insulating film for a re-distribution layer.

<18> A cured film obtained by curing the photosensitive resin composition according to any one of <1> to <17>.

<19> A laminate comprising two or more cured films according to <18>.

<20> The laminate according to <19>, further comprising a metal layer between the cured films.

<21> A method for producing a cured film, comprising using the photosensitive resin composition according to any one of <1> to <17>.

<22> The method for producing a cured film according to <21>, comprising:
a photosensitive resin composition layer forming step of applying the photosensitive resin composition to a substrate to form a layer;
an exposure step of exposing the photosensitive resin composition layer, and
a development treatment step of subjecting the exposed photosensitive resin composition layer to a development treatment.

<23> The method for producing a cured film according to <22>, in which the development treatment is a negative tone development treatment.

<24> A method for producing a laminate, comprising:
forming a cured film in accordance with the method for producing a cured film according to <22> or <23>; and then
further carrying out the photosensitive resin composition layer forming step, the exposure step, and the development treatment step, in this order, 2 to 5 times.

<25> A semiconductor device comprising the cured film according to <18> or the laminate according to <19> or <20>.

According to the present invention, it is possible to provide a photosensitive resin composition in which warping of a cured film after curing is decreased and lithographic properties in a case of forming a pattern are excellent, a cured film, a laminate, a method for producing a cured film, and a semiconductor device.

DESCRIPTION OF THE PREFERRED EMBODIMENTS

The following description of constituent elements in the present invention may be made based on representative embodiments of the present invention. However, the present invention is not limited to such embodiments.

In describing a group (atomic group) in the present specification, a description having no indication about substitution and non-substitution includes a description having a substituent as well as a description having no substituent. For example, "alkyl group" includes not only an alkyl group (unsubstituted alkyl group) having no substituent but also an alkyl group (substituted alkyl group) having a substituent.

In the present specification, unless otherwise specified, "exposure" includes not only exposure using light but also lithography with particle beams such as electron beams and ion beams. In addition, as light used for exposure, generally, actinic rays or radiations such as a bright line spectrum of a mercury lamp, far ultraviolet rays typified by excimer laser, extreme ultraviolet rays (EUV light), X-rays, and electron beams are mentioned.

In the present specification, a numerical range expressed using "to" means a range including numerical values described before and after the preposition "to" as a lower limit value and an upper limit value.

In the present specification, "(meth)acrylate" represents either or both of "acrylate" and "methacrylate", "(meth)acryl" means either or both of "acryl" and "methacryl", and "(meth)acryloyl" represents either or both of "acryloyl" and "methacryloyl".

In the present specification, the term "step" not only includes an independent step, but also steps in a case where an intended action of the step is achieved even though it is not possible to make a clear distinction from the other step.

In the present specification, a solid content is a mass percentage of other components excluding a solvent with respect to a total mass of a composition. In addition, the concentration of solid contents refers to a concentration at 25° C. unless otherwise stated.

In the present specification, unless otherwise stated, weight-average molecular weight (Mw) and number-average molecular weight (Mn) are defined as polystyrene equivalent values according to gel permeation chromatography (GPC measurement). In the present specification, the weight-average molecular weight (Mw) and the number-average molecular weight (Mn) can be obtained, for example, by using HLC-8220 (manufactured by Tosoh Corporation) and using, as a column, GUARD COLUMN HZ-L, TSKgel Super HZM-M, TSK gel Super HZ4000, TSK gel Super HZ3000, TSK gel Super HZ2000 (manufactured by Tosoh Corporation). Unless otherwise stated, measurement is performed using tetrahydrofuran (THF) as an eluent. In addition, unless otherwise stated, detection is made using a detector having an ultraviolet ray (UV ray) wavelength of 254 nm.

<Photosensitive Resin Composition>

A photosensitive resin composition according to the embodiment of the present invention (hereinafter, simply, referred to as the "composition of the embodiment of the present invention") includes a polyimide precursor including a repeating unit including a biphenyl structure and a photopolymerization initiator having an oxime structure capable of generating an aryl radical by being irradiated with light. With such a constitution, it is possible to obtain a photosensitive resin composition in which warping of a cured film after curing is decreased and lithographic properties in a case of forming a pattern are excellent.

The reason is presumed as follows. That is, an aryl radical generated from the photopolymerization initiator having the oxime structure capable of generating an aryl radical by being irradiated with light (hereinafter, simply, referred to as "specific oxime-based polymerization initiator") has high diffusibility and high activity. On the other hand, by introducing the biphenyl structure into the main chain of the polyimide precursor, a rigidity of the polyimide precursor is increased and a mobility of the main chain of the polyimide precursor is decreased, so that thermal expansion coefficient is decreased. In addition, since an affinity between the aryl radical and the biphenyl structure is high, it is considered that low warping property and lithographic properties can be improved.

<<Polyimide Precursor>>

A polyimide precursor used in the present invention includes a repeating unit including a biphenyl structure. In addition, a molar ratio of the repeating unit including a biphenyl structure to the repeating unit including a biphenyloxy structure is preferably 30:70 to 70:30, more preferably 35:65 to 65:35, even more preferably 40:60 to 60:40, and still more preferably 45:55 to 55:45. With such a range setting, the effect of the present invention is exhibited more effectively.

For the repeating unit including a biphenyl structure and the repeating unit including a biphenyloxy structure, one type may be contained, or two or more types may be contained. In a case where two or more types are contained, a total molar ratio thereof is preferably within the above-mentioned range.

A polyimide precursor used in the present invention may include another repeating unit other than the repeating unit including a biphenyl structure and the repeating unit including a biphenyloxy structure. However, a polyimide precursor used in the present invention is preferable not to substantially include another repeating unit other than the repeating unit including a biphenyl structure and the repeating unit including a biphenyloxy structure. "Substantially" means that, a content of components other than the repeating unit including a biphenyl structure and the repeating unit including a biphenyloxy structure is 10% by mass or lower in the entire polyimide precursor of the present invention, preferably 5% by mass or lower, and more preferably 3% by mass or lower.

<<<Repeating Unit Including Biphenyl Structure>>>

A biphenyl structure means a structure having a biphenyl skeleton, and may have a substituent on a benzene ring constituting the biphenyl skeleton.

The repeating unit including a biphenyl structure is preferable to include a structure derived from a tetracarboxylic acid. That is, the structure is preferably formed of at least one type of a tetracarboxylic acid or a tetracarboxylic acid dianhydride.

The tetracarboxylic acid dianhydride is preferably a compound represented by Formula (O-1).

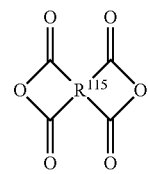

Formula (O-1)

In Formula (O-1), $R^{115}$ is a tetravalent group represented by Formula (O-1-1).

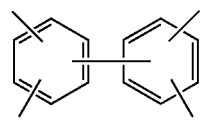

Formula (O-1-1)

A group represented by Formula (O-1-1) is preferably a group represented by Formula (O-1-2).

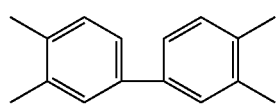

Formula (O-1-2)

In the present invention, the repeating unit including a biphenyl structure is preferably a repeating unit represented by Formula (1).

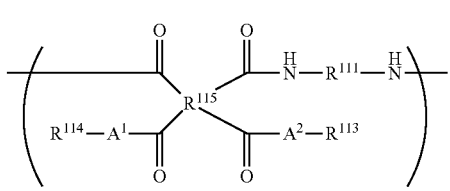

Formula (1)

in Formula (1), $A^1$ and $A^2$ each independently represent an oxygen atom or NH, $R^{111}$ represents a divalent organic group, $R^{115}$ represents a tetravalent organic group having a biphenyl skeleton, and $R^{113}$ and $R^{114}$ each independently represent a group including a radically polymerizable group.

In Formula (1), $A^1$ and $A^2$ are preferably an oxygen atom or NH, and more preferably an oxygen atom.

$R^{111}$ in Formula (1) represents a divalent organic group. As the divalent organic group, a linear or branched aliphatic group, a cyclic aliphatic group, and a group containing an aromatic group are exemplified. The divalent organic group is preferably a linear aliphatic group having 2 to 20 carbon atoms, a branched aliphatic group having 3 to 20 carbon atoms, a cyclic aliphatic group having 3 to 20 carbon atoms, an aromatic group having 6 to 20 carbon atoms, or a group consisting of a combination thereof, and is more preferably a group consisting of an aromatic group having 6 to 20 carbon atoms.

In the present invention, $R^{111}$ in Formula (1) is preferably represented by —Ar-L-Ar—. Here, Ar's each independently represent an aromatic hydrocarbon group, and L is a group selected from the group consisting of an aliphatic hydrocarbon group having 1 to 10 carbon atoms which may be substituted with a fluorine atom, —O—, —CO—, —S—, —SO$_2$—, —NHCO—, and a group obtained by combining two or more thereof.

Ar is preferably a benzene ring. L is preferably —O—.

$R^{111}$ is preferably derived from diamine. As the diamine used for producing the polyimide precursor, linear or branched aliphatic, cyclic aliphatic, or aromatic diamine, or the like is mentioned. For the diamine, only one type may be used, or two or more types may be used.

Specifically, diamine containing a linear aliphatic group having 2 to 20 carbon atoms, a branched or a cyclic aliphatic group having 3 to 20 carbon atoms, an aromatic group having 6 to 20 carbon atoms, or a group consisting of a combination thereof is preferable, and diamine containing a group consisting of an aromatic group having 6 to 20 carbon atoms is more preferable.

Specifically, examples of diamine include compounds described in paragraph 0083 of JP2016-027357A and paragraphs 0033 to 0035 of WO2016/194769A.

In addition, as preferable examples of the diamine, diamines having at least two or more alkylene glycol units in a main chain are also mentioned. Diamines containing two or more in total of either or both of ethylene glycol chain and propylene glycol chain in one molecule are more preferable, and diamines containing no aromatic ring are even more preferable. As specific examples thereof, JEFFAMINE (registered trademark) KH-511, JEFFAMINE (registered trademark) ED-600, JEFFAMINE (registered trademark) ED-900, JEFFAMINE (registered trademark) ED-2003, JEFFAMINE (registered trademark) EDR-148, JEFFAMINE (registered trademark) EDR-176, D-200, D-400, D-2000, D-4000 (all trade names, manufactured by Huntsman Corporation), 1-(2-(2-(2-aminopropoxy)ethoxy)propoxy)propane-2-amine, and 1-(1-(1-(2-aminopropoxy)propan-2-yl)oxy)propane-2-amine are mentioned, but not limited thereto.

Structures of JEFFAMINE (registered trademark) KH-511, JEFFAMINE (registered trademark) ED-600, JEFFAMINE (registered trademark) ED-900, JEFFAMINE (registered trademark) ED-2003, JEFFAMINE (registered trademark) EDR-148, and JEFFAMINE (registered trademark) EDR-176 are shown below.

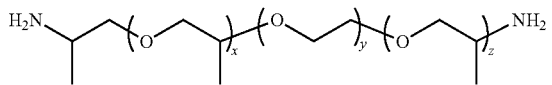

KH-511 (y = 2.0, x + z = 1.2)
ED-600 (y = 9.0, x + z = 3.6)
ED-900 (y = 12.5, x + z = 6.0)
ED-2003 (y = 39.0, x + z = 6.0)

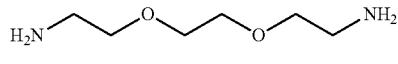

EDR-148

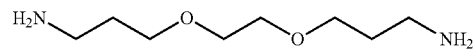

EDR-176

In the above, x, y, and z are average values.

In Formula (1), $R^{115}$ is preferably a group represented by Formula (O-1-1) and more preferably a group represented by Formula (O-1-2). In a case where $R^{115}$ is represented by Formula (O-1-2), lower side linkers in Formula (O-1-2) are preferably respectively connected to $R^{114}$-$A^1$-C(=O)— and $R^{113}$-$A^2$-C(=O)— in Formula (1).

$R^{113}$ and $R^{114}$ are each independently a group including a radically polymerizable group, and preferably a radically polymerizable group. The radically polymerizable group is a group capable of undergoing a crosslinking reaction by an action of a radical, and preferable examples thereof include a group having an ethylenically unsaturated bond.

As the group having an ethylenically unsaturated bond, a vinyl group, a (meth)allyl group, a group represented by Formula (III), and the like are mentioned.

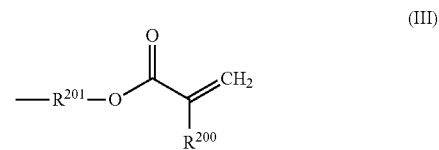

(III)

In Formula (III), $R^{200}$ represents a hydrogen atom or a methyl group, with a methyl group being more preferable.

In Formula (III), $R^{201}$ represents an alkylene group having 2 to 12 carbon atoms, —CH$_2$CH(OH)CH$_2$—, or a polyoxyalkylene group having 4 to 30 carbon atoms.

Suitable examples of $R^{201}$ include an ethylene group, a propylene group, a trimethylene group, a tetramethylene group, a 1,2-butanediyl group, a 1,3-butanediyl group, a pentamethylene group, a hexamethylene group, an octamethylene group, a dodecamethylene group, and —CH$_2$CH(OH)CH$_2$—, with an ethylene group, a propylene group, a trimethylene group, and —CH$_2$CH(OH)CH$_2$— being more preferable.

Particularly preferably, $R^{200}$ is a methyl group, and $R^{201}$ is an ethylene group.

<<<Repeating Unit Including Biphenyloxy Structure>>>

A biphenyloxy structure means a structure having a biphenyloxy skeleton, and may have a substituent on a benzene ring constituting the biphenyloxy skeleton.

The repeating unit including a biphenyloxy structure is preferable to include a structure derived from a tetracarboxylic acid. That is, the structure is preferably formed of at least one type of a tetracarboxylic acid or a tetracarboxylic acid dianhydride.

The tetracarboxylic acid dianhydride is preferably a compound represented by Formula (O-2).

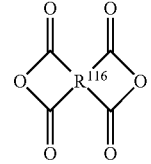

Formula (O-2)

In Formula (O-2), $R^{116}$ is a tetravalent group represented by Formula (O-2-1).

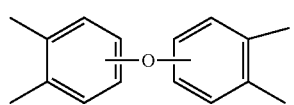

Formula (O-2-1)

A group represented by Formula (O-2-1) is preferably a group represented by Formula (O-2-2).

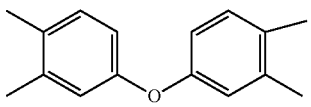

Formula (O-2-2)

In the present invention, the repeating unit including a biphenyloxy structure is preferably a repeating unit represented by Formula (2).

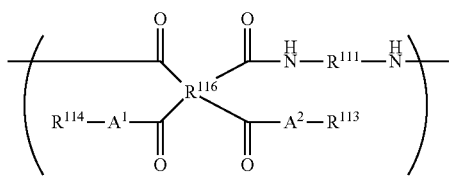

Formula (2)

In Formula (2), $A^1$ and $A^2$ each independently represent an oxygen atom or NH, $R^{111}$ represents a divalent organic group, $R^{116}$ represents a tetravalent organic group having a biphenyloxy skeleton, and $R^{113}$ and $R^{114}$ each independently represent a group including a radically polymerizable group.

$A^1$, $A^2$, $R^{111}$, $R^{113}$, and $R^{114}$ in Formula (2) each independently have the same meaning as $A^1$, $A^2$, $R^{111}$, $R^{113}$, and $R^{114}$ in Formula (1), and preferable ranges thereof are also the same. Accordingly, $R^{111}$ in Formula (2) is preferably represented by the above-mentioned —Ar-L-Ar—.

In Formula (2), $R^{116}$ is preferably a group represented by Formula (O-2-1) and more preferably a group represented by Formula (O-2-2). In a case where $R^{116}$ is represented by Formula (O-2-2), lower side linkers in Formula (O-2-2) are preferably respectively connected to $R^{114}$-$A^1$-C(=O)— and $R^{113}$-$A^2$-C(=O)— in Formula (2).

<<<Property of Polyimide Precursor>>>

In the polyimide precursor used in the present invention, a ring closure rate calculated from an NH signal of nuclear magnetic resonance spectrum is preferably 20% to 40% and more preferably 20% to 30%. With such a range setting, lithographic properties tend to be further improved.

A weight-average molecular weight (Mw) of the polyimide precursor is preferably 2000 or higher, more preferably 5000 or higher, even more preferably 10000 or higher, and still more preferably 20000 or higher. In addition, Mw of the polyimide precursor is preferably 500000 or lower, more preferably 100000 or lower, even more preferably 50000 or lower, and still more preferably 25000 or lower. With such a range setting, solubility of an unexposed portion during development can be within a more appropriate range and lithographic properties tend to be further improved.

A molecular weight dispersion (Mw/Mn) of the polyimide precursor is preferably 1.3 or higher, more preferably 1.5 or higher, and even more preferably 1.6 or higher. In addition, the molecular weight dispersion of the polyimide precursor is preferably 2.5 or lower, more preferably 2.3 or lower, even more preferably 2.2 or lower, still more preferably 2.0 or lower, and even still more preferably 1.8 or lower. With such a range setting, the effect of the present invention is exhibited more effectively.

The ring closure rate, the weight-average molecular weight, and the molecular weight dispersion are measured in accordance with descriptions of examples as described later.

The polyimide precursor is obtained by reacting dicarboxylic acid or a dicarboxylic acid derivative with diamine. Preferably, the polyimide precursor is obtained by halogenating dicarboxylic acid or a dicarboxylic acid derivative with a halogenating agent, and then causing the resultant to be reacted with diamine.

In a method for producing the polyimide precursor, it is preferable to use an organic solvent at the time of reaction. For the organic solvent, one type may be used, or two or more types may be used.

The organic solvent can be appropriately determined according to raw materials, and pyridine, diethylene glycol dimethyl ether (diglyme), N-methylpyrrolidone, and N-ethylpyrrolidone are exemplified.

In a case of producing the polyimide precursor, it is preferable to include a step of precipitating a solid. Specifically, it is possible to precipitate a solid by causing the polyimide precursor in a reaction solution to be sedimented in water and causing the sedimented polyimide precursor to be dissolved in a solvent such as tetrahydrofuran in which the polyimide precursor is soluble.

<<Urea Compound>>

The photosensitive resin composition according to the embodiment of the present invention may contain a urea compound. Specifically, the urea compound is preferably contained in a ratio of 10 to 500 mass ppm, more preferably in a ratio of 10 to 90 mass ppm, and even more preferably in a ratio of 30 to 70 mass ppm, with respect to 100 parts by mass of the polyimide precursor. By setting the content of the urea compound to the upper limit or lower, temporal stability and lithographic properties tend to be further improved. Furthermore, warping properties are improved and reduction of film thickness during curing is decreased more effectively. In addition, by setting the content of the urea compound to the lower limit or more, an imide cyclization rate (ring closure rate) during curing can be improved.

In addition, in the present invention, the mass ratio of a specific oxime-based polymerization initiator to a urea compound which are contained in the photosensitive resin composition is preferably 1:0.001 to 0.01 and more preferably 1:0.001 to 0.005. With such a ratio, a crosslinking reaction which occurs after exposure can be effectively suppressed, and low warping properties can be achieved more effectively.

The content of the urea compound is measured in accordance with descriptions of examples.

<<Specific Oxime-Based Polymerization Initiator>>

The photosensitive resin composition according to the embodiment of the present invention includes a photopolymerization initiator (specific oxime-based polymerization initiator) having an oxime structure capable of generating an aryl radical by being irradiated with light. The photopolymerization initiator refers, for example, to a compound having a molar extinction coefficient of 50 or more within a wavelength range of 300 to 800 nm (preferably 330 to 500 nm). The molar extinction coefficient of the compound can be measured using a known method. For example, it is preferable to perform measurement at a concentration of 0.01 g/L using an ethyl acetate solvent with an ultraviolet-visible spectrophotometer (Cary-5 spectrophotometer manufactured by Varian).

The specific oxime-based polymerization initiator is a compound capable of generating an aryl radical by being irradiated with light. For example, as shown below, the specific oxime-based polymerization initiator refers to a compound in which an N—O bond is cleaved by irradiation of light and a radical which only consists of aryl is generated according to a decarboxylation.

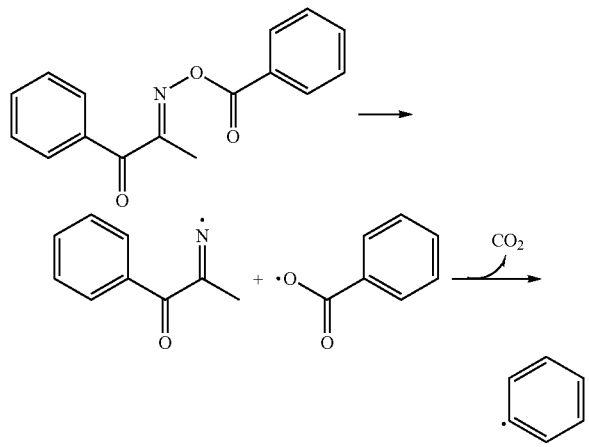

The aryl radical in the present invention is preferably a phenyl radical.

The specific oxime-based polymerization initiator capable of being used in the present invention is preferably represented by Formula (OX-1).

(OX-1)

In Formula (OX-1), R represents an arylcarbonyl group, and A and B each independently represent a monovalent substituent.

The arylcarbonyl group represented by R is preferably a phenylcarbonyl group or a naphthylcarbonyl group, and more preferably a phenylcarbonyl group. The arylcarbonyl group represented by R may or may not have a substituent, but preferably does not have a substituent.

The monovalent substituent represented by B is preferably an aryl group, a heterocyclic group, an arylcarbonyl group, or a heterocyclic carbonyl group. The above groups may have one or more substituent.

The monovalent organic group represented by A is preferably an alkylene group, a cycloalkylene group, or an alkynylene group, which has 1 to 12 carbon atoms. The above groups may have one or more substituent.

In Formula (OX-1), a N—O bond in the oxime structure may be (E)-isomer, (Z)-isomer, or a mixture of (E)-isomer and (Z)-isomer.

Examples of the specific oxime-based polymerization initiator capable of being used in the present invention include polymerization initiators A-1, A-3, A-4, and the like, which are used in the examples described later.

The content of the specific oxime-based polymerization initiator is preferably 0.1% to 30% by mass, more preferably 0.1% to 20% by mass, even more preferably 0.5% to 15% by mass, and still more preferably 1.0% to 10% by mass, with respect to the total solid content of the photosensitive resin composition according to the embodiment of the present invention.

For the specific oxime-based polymerization initiator, only one type may be contained, or two or more types may be contained. In a case where two or more types of specific oxime-based polymerization initiators are contained, a total thereof is preferably within the above-mentioned range.

The photosensitive resin composition according to the embodiment of the present invention may contain an oxime-based photo-radical polymerization initiator other than the specific oxime-based polymerization initiator or a photo-radical polymerization initiator other than the oxime-based photo-radical polymerization initiator.

For the specific examples, compounds described in paragraphs 0263 to 0281 of JP2016-102191A are exemplified.

Examples of the embodiment of the present invention include the specific oxime-based polymerization initiator and a photo-radical polymerization initiator other than the oxime-based photo-radical polymerization initiator. Examples of the photo-radical polymerization initiator other than the oxime-based photo-radical polymerization initiator include coumarin-based photo-radical polymerization initiators or amine-based photo-radical polymerization initiators.

In a case where the specific oxime-based polymerization initiator and a photo-radical polymerization initiator other than the oxime-based photo-radical polymerization initiator are used in a combination, the content of the photo-radical polymerization initiator other than the oxime-based photo-radical polymerization initiator is preferably 0.001 to 0.1 parts by mass with respect to the content of the specific oxime-based polymerization initiator.

<<Solvent>>

The photosensitive resin composition according to the embodiment of the present invention preferably includes a solvent. As the solvent, a known solvent can be optionally used. The solvent is preferably an organic solvent. As the organic solvent, compounds such as esters, ethers, ketones, aromatic hydrocarbons, sulfoxides, and amides are mentioned.

As the esters, for example, ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, γ-butyrolactone, ε-caprolactone, δ-valerolactone, alkyl alkyloxyacetate (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (for example, methyl 3-alkyloxypropionate, and ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methylpropionate and ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate are suitably mentioned.

As the ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate are suitably mentioned.

As the ketones, for example, methyl ethyl ketone, cyclohexanone, cyclopentanone, 2-heptanone, and 3-heptanone are suitably mentioned.

As the aromatic hydrocarbons, for example, toluene, xylene, anisole, and limonene are suitably mentioned.

As the sulfoxides, for example, dimethyl sulfoxide is suitably mentioned.

As the amides, N-methyl-2-pyrrolidone, N-ethyl-2-pyrrolidone, N,N-dimethylacetamide, N,N-dimethylformamide, and the like are suitably mentioned.

From the viewpoint of improving properties of a coated surface or the like, it is also preferable to mix two or more types of solvents.

In the present invention, the preferable solvents are one type of solvent selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethyl sulfoxide, ethyl carbitol acetate, butyl carbitol acetate, N-methyl-2-pyrrolidone, propylene glycol methyl ether, propylene glycol methyl ether acetate, or a mixed solvent consisting of two or more types of the solvents.

From the viewpoint of coating property, the content of the solvent is such that the total solid content concentration of the photosensitive resin composition according to the embodiment of the present invention is preferably 5% to 80% by mass, more preferably 5% to 70% by mass, and particularly preferably 10% to 60% by mass. The content of the solvent may be adjusted depending on a desired thickness and a coating method.

For the solvent, one type may be contained, or two or more types may be contained. In a case where two or more types of solvents are contained, a total thereof is preferably within the above-mentioned range.

<<Thermal-Radical Polymerization Initiator>>

The photosensitive resin composition according to the embodiment of the present invention may contain a thermal-radical polymerization initiator within the scope without departing from the gist of the present invention.

The thermal-radical polymerization initiator is a compound which generates radicals by heat energy and initiates or promotes a polymerization reaction of a compound having polymerization properties. By adding the thermal-radical polymerization initiator, a polymerization reaction of the polyimide precursor can proceed together with cyclization of the polyimide precursor. Thus, a higher degree of heat resistance can be achieved.

Specifically, as the thermal-radical polymerization initiator, compounds described in paragraphs 0074 to 0118 of JP2008-063554A are mentioned.

In a case where the thermal-radical polymerization initiator is contained, the content thereof is preferably 0.1% to 30% by mass, with respect to the total solid content of the photosensitive resin composition according to the embodiment of the present invention, more preferably 0.1% to 20% by mass, and even more preferably 5% to 15% by mass. For the thermal-radical polymerization initiator, only one type may be contained, or two or more types may be contained. In a case where two or more types of thermal-radical polymerization initiators are contained, a total thereof is preferably within the above-mentioned range.

<<Radically Polymerizable Compound>>

The photosensitive resin composition according to the embodiment of the present invention preferably contains a radically polymerizable compound (hereinafter, also referred to as a "polymerizable monomer"). By adopting such a constitution, a cured film which is excellent in heat resistance can be formed.

As the polymerizable monomer, a compound having a radically polymerizable group can be used. As the radically polymerizable group, a group having an ethylenically unsaturated bond such as a styryl group, a vinyl group, a (meth)acryloyl group, and an allyl group is mentioned. The radically polymerizable group is preferably a (meth)acryloyl group.

The polymerizable monomer may have one radically polymerizable group or two or more radically polymerizable groups. The polymerizable monomer preferably has two or more radically polymerizable groups, and more preferably three or more radically polymerizable groups. The upper limit thereof is preferably 15 or lower, more preferably 10 or lower, and even more preferably 8 or lower. A polymerizable monomer having two or more radically polymerizable groups acts as a crosslinking agent.

A molecular weight of the polymerizable monomer is preferably 2,000 or lower, more preferably 1,500 or lower, and even more preferably 900 or lower. The lower limit of the molecular weight of the polymerizable monomer is preferably 100 or higher.

From the viewpoint of developability, the photosensitive resin composition according to the embodiment of the present invention preferably contains at least one bi- or higher-functional polymerizable monomer containing two or more polymerizable groups, and more preferably contains at least one tri- or higher-functional polymerizable monomer. In addition, the polymerizable monomer may be a mixture of a bifunctional polymerizable monomer and a tri- or higher-functional polymerizable monomer. The number of functional groups in the polymerizable monomer means the number of radically polymerizable groups in one molecule.

The photosensitive resin composition according to the embodiment of the present invention preferably contains a (meth)acrylate including -(alkyl chain-O)$_4$— structure, a (meth)acrylate including -(alkyl chain-O)$_5$— structure, and a (meth)acrylate including -(alkyl chain-O)$_6$— structure as a polymerizable monomer. By blending the three types of (meth)acrylate, lithographic properties can be further improved. The reason is presumed that the solubility of the unexposed portion to a developer and the mobility of (meth)acrylate in a cured film are increased, so that a reaction rate of carbon-carbon double bond in (meth)acrylate is improved. In addition, it is considered that mobility of polymer (polyimide precursor and polyimide resin) during a cyclization reaction can be increased, so that an imide cyclization rate is further improved.

The mass ratio of the (meth)acrylate including -(alkyl chain-O)$_4$— structure, the (meth)acrylate including -(alkyl chain-O)$_5$— structure, and the (meth)acrylate including -(alkyl chain-O)$_6$— structure is preferably 1:0.01 to 5.0:0.01 to 5.0. Furthermore, the photosensitive resin composition according to the embodiment of the present invention preferably contains a (meth)acrylate including -(alkyl chain-O)$_7$— structure or a (meth)acrylate including -(alkyl chain-O)$_8$— structure.

The alkyl chain is preferably an ethylene chain.

The (meth)acrylate is preferably a bi- or higher-functional (meth)acrylate.

In the present invention, as a polymerizable monomer, it is preferable to include a mixture including a polyethylene glycol di(meth)acrylate having 4 to 6 ethyleneoxy chains, and more preferable to include a mixture including a polyethylene glycol di(meth)acrylate having 4 to 8 ethyleneoxy chains.

As commercially available products of the polyethylene glycol di(meth)acrylate, polymerizable monomers manufactured by Tokyo Chemical Industry Co., Ltd. are exemplified.

Other examples of the polymerizable monomer include unsaturated carboxylic acids (for example, acrylic acid, methacrylic acid, itaconic acid, crotonic acid, isocrotonic acid, and maleic acid), and esters and amides thereof, and preferably esters of unsaturated carboxylic acids with polyhydric alcohol compounds, and amides of unsaturated carboxylic acids with polyamine compounds. In addition, addition reaction products of unsaturated carboxylic acid esters or amides having a nucleophilic substituent such as a hydroxyl group, an amino group, and a mercapto group, with monofunctional or polyfunctional isocyanates or epoxies, dehydration condensation reaction products thereof with monofunctional or polyfunctional carboxylic acids, and the like are also suitably used. In addition, addition reaction products of unsaturated carboxylic acid esters or amides having an electrophilic substituent such as an isocyanate group and an epoxy group, with monofunctional or polyfunctional alcohols, amines, or thiols, and substitution reaction products of unsaturated carboxylic acid esters or amides having a leaving substituent such as a halogen group and a tosyloxy group with monofunctional or polyfunctional alcohols, amines, or thiols are also suitable. In addition, as another example, it is also possible to use a group of compounds in which the unsaturated carboxylic acid is substituted with an unsaturated phosphonic acid, a vinylbenzene derivative such as styrene, vinyl ether, allyl ether, or the like. As specific examples, reference can be made to the description of paragraphs 0113 to 0122 of JP2016-027357A, the content of which is incorporated herein.

In addition, the polymerizable monomer is also preferably a compound having a boiling point of 100° C. or higher under atmospheric pressure. As examples thereof, compounds obtained by adding ethylene oxide or propylene oxide to a polyfunctional alcohol such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri (acryloyloxypropyl)ether, tri(acryloyloxyethyl) isocyanurate, glycerin, and trimethylolethane, and then being subjected to (meth)acrylation, the urethane (meth) acrylates as described in JP1973-041708B (JP-S48-041708B), JP1975-006034B (JP-S50-006034B), and JP1976-037193A (JP-S51-037193A), polyester acrylates described in JP1973-064183A (JP-S48-064183A), JP1974-043191B (JP-S49-043191B), and JP1977-030490B (JP-S52-030490B), polyfunctional acrylates or methacrylates such as epoxy acrylates which are reaction products of epoxy resins and (meth)acrylic acids, and mixtures thereof can be mentioned. In addition, the compounds described in paragraphs 0254 to 0257 of JP2008-292970A are also suitable. Moreover, the polyfunctional (meth)acrylate or the like obtained by reacting a compound having a cyclic ether group and an ethylenically unsaturated group, such as glycidyl (meth)acrylate, with polyfunctional carboxylic acid can also be mentioned.

In addition, as other preferable polymerizable monomers, compounds having two or more groups containing a fluorene ring and an ethylenically unsaturated bond and cardo resins which are described in JP2010-160418A, JP2010-129825A, and JP4364216B can also be used.

Furthermore, as other examples, the specific unsaturated compounds described in JP1971-043946B (JP-S46-043946B), JP1989-040337B (JP-H1-040337B), and JP1989-040336B (JP-H1-040336B), the vinylphosphonic acid-based compounds described in JP1990-025493A (JP-H2-025493A), and the like can also be mentioned. In addition, the compounds containing a perfluoroalkyl group described in JP 1986-022048A (JP-S61-022048A) can also be used. Furthermore, photopolymerizable monomers and oligomers which are described in Journal of Japan Adhesive Association vol. 20, No. 7, pages 300 to 308 (1984) can also be used.

In addition to the above, the compounds described in paragraphs 0048 to 0051 of JP2015-034964A can also be preferably used, the content of which is incorporated herein.

In addition, the compounds which are described in JP1998-062986A (JP-H10-062986A) as Formulas (1) and (2) as well as specific examples thereof and are obtained by adding ethylene oxide or propylene oxide to a polyfunctional alcohol and then being subjected to (meth)acrylation can be used as the polymerizable monomer.

Furthermore, the compounds described in paragraphs 0104 to 0131 of JP2015-187211A can also be used as the polymerizable monomer, the content of which is incorporated herein.

As the polymerizable monomer, dipentaerythritol triacrylate (as a commercially available product, KAYARAD D-330; manufactured by Nippon Kayaku Co., Ltd.), dipentaerythritol tetraacrylate (as a commercially available product, KAYARAD D-320; manufactured by Nippon Kayaku Co., Ltd., A-TMMT: manufactured by Shin-Nakamura Chemical Co., Ltd.), dipentaerythritol penta(meth)acrylate (as a commercially available product, KAYARAD D-310; manufactured by Nippon Kayaku Co., Ltd.), dipentaerythritol hexa(meth)acrylate (as commercially available product, KAYARAD DPHA; manufactured by Nippon Kayaku Co., Ltd., A-DPH; manufactured by Shin-Nakamura Chemical Co., Ltd.), and structures in which (meth)acryloyl groups thereof are bonded via ethylene glycol or propylene glycol residues are preferable. Oligomer types thereof can also be used.

As commercially available products of the polymerizable monomer, for example, SR-494 which is a tetrafunctional acrylate having four ethyleneoxy chains, manufactured by Sartomer, SR-209 which is a bifunctional methacrylate having four ethyleneoxy chains, manufactured by Sartomer, DPCA-60 which is a hexafunctional acrylate having six pentyleneoxy chains, manufactured by Nippon Kayaku Co., Ltd., TPA-330 which is a trifunctional acrylate having three isobutyleneoxy chains, urethane oligomers UAS-10, UAB-140 (manufactured by Nippon Paper Industries Co., Ltd.), NK Ester M-40G, NK Ester 4G, NK Ester M-9300, NK Ester A-9300, UA-7200 (manufactured by Shin-Nakamura Chemical Co., Ltd.), DPHA-40H (manufactured by Nippon Kayaku Co., Ltd.), UA-306H, UA-306T, UA-306I, AH-600, T-600, AI-600 (manufactured by Kyoeisha Chemical Co., Ltd.), Brenmer PME400 (manufactured by NOF Corporation), and the like are mentioned.

As the polymerizable monomer, the urethane acrylates as described in JP1973-041708B (JP-S48-041708B), JP1976-037193A (JP-S51-037193A), JP1990-032293B (JP-H2-032293B), and JP1990-016765B (JP-H2-016765B), and the urethane compounds having an ethylene oxide-based skeleton described in JP1983-049860B (JP-S58-049860B), JP1981-017654B (JP-S56-017654B), JP1987-039417B (JP-S62-039417B), and JP1987-039418B (JP-S62-039418B) are also suitable. Furthermore, as the polymerizable monomer, the compounds having an amino structure or a sulfide structure in a molecule as described in JP1988-277653A (JP-S63-277653A), JP1988-260909A (JP-S63-260909A), and JP1989-105238A (JP-H1-105238A) can also be used.

The polymerizable monomer may be a polymerizable monomer having an acid group such as a carboxyl group, a sulfo group, and a phosphoric acid group. The polymerizable monomer having an acid group is preferably ester of an aliphatic polyhydroxy compound and an unsaturated carboxylic acid, and more preferably a polymerizable monomer obtained by reacting an unreacted hydroxyl group of an aliphatic polyhydroxy compound with a non-aromatic carboxylic acid anhydride so as to have an acid group. Particularly preferably, the polymerizable monomer is a polymerizable monomer having an acid group obtained by reacting an unreacted hydroxyl group of an aliphatic polyhydroxy compound with a non-aromatic carboxylic acid anhydride so as to have an acid group, in which the aliphatic polyhydroxy compound is pentaerythritol and/or dipentaerythritol. As commercially available products thereof, for example, M-510 and M-520 as polybasic acid-modified acrylic oligomers which are manufactured by Toagosei Co., Ltd. are mentioned.

For the polymerizable monomer having an acid group, one type may be used alone, or two or more types may be used in admixture. In addition, if necessary, a polymerizable monomer having no acid group and a polymerizable monomer having an acid group may be used in combination.

An acid value of the polymerizable monomer having an acid group is preferably 0.1 to 40 mg KOH/g, and particularly preferably 5 to 30 mg KOH/g. In a case where the acid value of the polymerizable monomer is within the above-mentioned range, excellent production and handling properties are exhibited, and furthermore, excellent developability is exhibited. In addition, good polymerization properties are exhibited.

From the viewpoint of good polymerization properties and heat resistance, the content of polymerizable monomer is preferably 1% to 60% by mass, with respect to the total solid content of the photosensitive resin composition according to the embodiment of the present invention. The lower limit thereof is more preferably 5% by mass or higher. The upper limit thereof is more preferably 50% by mass or lower, and even more preferably 30% by mass or lower. For the polymerizable monomer, one type may be used alone, or two or more types may be used in admixture.

In addition, the mass ratio of the polyimide precursor to the polymerizable monomer (polyimide precursor/polymerizable monomer) is preferably 98/2 to 10/90, more preferably 95/5 to 30/70, even more preferably 90/10 to 50/50, and still more preferably 90/10 to 75/25. In a case where the mass ratio of the polyimide precursor to the polymerizable monomer is within the above-mentioned range, a cured film which is excellent in polymerization properties and heat resistance can be formed.

In particular, the content of the (meth)acrylate mixture including 4 to 8 (preferably 4 to 6) (alkyl chain-O) structures is preferably 1 to 20 parts by mass and more preferably 5 to 15 parts by mass, with respect to 100 parts by mass of the polyimide precursor.

In addition, in polymerizable compounds included in the photosensitive resin composition according to the embodiment of the present invention, a ratio of the (meth)acrylate including 4 to 8 (alkyl chain-O) structures is preferably more than 90% by mass.

<<Other Polymerizable Compounds>>

The photosensitive resin composition according to the embodiment of the present invention may further contain other polymerizable compounds, in addition to the polyimide precursor and the radically polymerizable compound described above. As the other polymerizable compounds, a compound having a hydroxymethyl group, an alkoxymethyl group, or an acyloxymethyl group; an epoxy compound; an oxetane compound; and a benzoxazine compound are mentioned. With regard to details thereof, reference can be made to the description of paragraphs 0120 to 0137 of WO2016/194769A, the content of which is incorporated herein.

<<Migration Suppressing Agent>>

The photosensitive resin composition preferably further contains a migration suppressing agent. By containing the migration suppressing agent, it is possible to effectively prevent metal ions derived from a metal layer (metal wiring) from being migrated into a photosensitive resin composition layer.

As the migration suppressing agent, there is no particular limitation, and compounds having a heterocyclic ring (a pyrrole ring, a furan ring, a thiophene ring, an imidazole ring, an oxazole ring, a thiazole ring, a pyrazole ring, an isoxazole ring, an isothiazole ring, a tetrazole ring, a pyridine ring, a pyridazine ring, a pyrimidine ring, a pyrazine ring, a piperidine ring, a piperazine ring, a morpholine ring, a 2H-pyran ring and a 6H-pyran ring, a triazine ring), compounds having thioureas and a mercapto group, hindered phenol-based compounds, salicylic acid derivative-based compounds, and hydrazide derivative-based compounds are mentioned. In particular, triazole-based compounds such as 1,2,4-triazole and benzotriazole, and tetrazole-based compounds such as 1H-tetrazole and benzotetrazole can be preferably used.

In addition, an ion trapping agent that captures an anion such as a halogen ion can also be used.

As other migration suppressing agents, the rust inhibitors described in paragraphs 0094 to 0097 of JP2013-015701A, the compounds described in paragraphs 0073 to 0076 of JP2009-283711A, the compounds described in paragraph 0052 of JP2011-059656A, and the compounds described in paragraphs 0114, 0116, and 0118 of JP2012-194520A, and the like can be used.

The following compounds can be mentioned as specific examples of the migration suppressing agent.

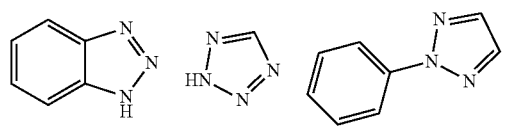

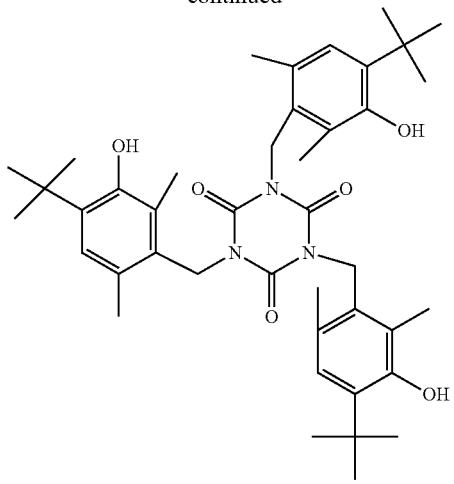

In a case where the photosensitive resin composition has the migration suppressing agent, a content of the migration suppressing agent is preferably 0.01% to 5.0% by mass, more preferably 0.05% to 2.0% by mass, and even more preferably 0.1% to 1.0% by mass, with respect to a total solid content of the photosensitive resin composition.

For the migration suppressing agent, only one type may be used, or two or more types may be used. In a case where two or more types of migration suppressing agents are used, a total thereof is preferably within the above-mentioned range.

<<Polymerization Inhibitor>>

The photosensitive resin composition of the embodiment of the present invention preferably contains a polymerization inhibitor.

As the polymerization inhibitor, for example, hydroquinone, 1,4-methoxyphenol, di-tert-butyl-p-cresol, pyrogallol, p-tert-butylcatechol, 1,4-benzoquinone, diphenyl-p-benzoquinone, 4,4'-thiobis(3-methyl-6-tert-butylphenol), 2,2'-methylenebis(4-methyl-6-tert-butylphenol), N-nitroso-N-phenylhydroxyamine aluminum salt, phenothiazine, N-nitrosodiphenylamine, N-phenyl naphthylamine, ethylenediamine tetraacetic acid, 1,2-cyclohexanediamine tetraacetic acid, glycol ether diamine tetraacetic acid, 2,6-di-tert-butyl-4-methyl phenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-(1-naphthyl)hydroxyamine ammonium salt, bis(4-hydroxy-3,5-tert-butyl)phenylmethane, and the like are suitably used. In addition, the polymerization inhibitors described in paragraph 0060 of JP2015-127817A and the compounds described in paragraphs 0031 to 0046 of WO2015/125469A can also be used.

In addition, the following compounds can be used (Me is a methyl group).

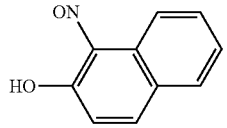

F-1

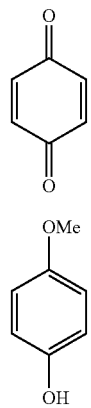

In a case where the photosensitive resin composition according to the embodiment of the present invention has a polymerization inhibitor, the content of the polymerization inhibitor is preferably 0.01% to 5% by mass with respect to the total solid content of the photosensitive resin composition according to the embodiment of the present invention.

For the polymerization inhibitor, only one type may be used, or two or more types may be used. In a case where two or more types of polymerization inhibitors are used, a total thereof is preferably within the above-mentioned range.

<<Metal Adhesiveness Improving Agent>>

The photosensitive resin composition according to the embodiment of the present invention preferably contains a metal adhesiveness improving agent for improving adhesiveness to a metal material used for electrodes, wirings, and the like. As the metal adhesiveness improving agent, a silane coupling agent and the like are mentioned.

As examples of the silane coupling agent, the compounds described in paragraphs 0062 to 0073 of JP2014-191002A, the compounds described in paragraphs 0063 to 0071 of WO2011/080992A1, the compounds described in paragraphs 0060 and 0061 of JP2014-191252A, the compounds described in paragraphs 0045 to 0052 of JP2014-041264A, and the compounds described in paragraph 0055 of WO2014/097594A are mentioned. In addition, it is also preferable to use two or more types of the different silane coupling agents as described in paragraphs 0050 to 0058 of JP2011-128358A. In addition, as the silane coupling agent, the following compounds are also preferably used. In the formulas, Et represents an ethyl group.

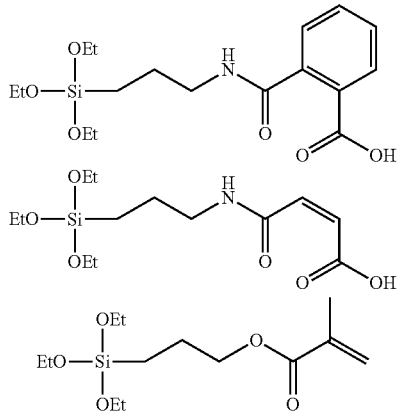

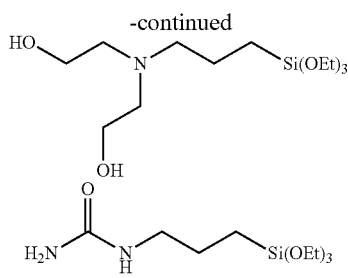

In addition, as the metal adhesiveness improving agent, the compounds described in paragraphs 0046 to 0049 of JP2014-186186A, and the sulfide-based compounds described in paragraphs 0032 to 0043 of JP2013-072935A can also be used.

The content of the metal adhesiveness improving agent is preferably 0.1 to 30 parts by mass, and more preferably 0.5 to 15 parts by mass with respect to 100 parts by mass of the polyimide precursor. In a case where the content is 0.1 parts by mass or higher, good adhesiveness between a cured film and a metal layer after a curing step is exhibited. In a case where the content is 30 parts by mass or lower, the cured film after the curing step exhibits good heat resistance and mechanical properties. For the metal adhesiveness improving agent, only one type may be used, or two or more types may be used. In a case where two or more types are used, a total thereof is preferably within the above-mentioned range.

<<Base Generator>>

The photosensitive resin composition according to the embodiment of the present invention may contain a base generator. The base generator may be a thermal-base generator or a photo-base generator, and preferably contains at least the photo-base generator.

<<<Thermal-Base Generator>>>

As the thermal-base generator, a type and the like thereof are not particularly specified, and the thermal-base generator preferably includes a thermal-base generator that contains at least one type selected from an acidic compound which generates a base in a case of being heated to 40° C. or higher, or an ammonium salt which has an ammonium cation and anion of which the pKa1 is 0 to 4. Herein, pKa1 is a logarithmic expression ($-\log_{10}$ Ka) of the dissociation constant (Ka) of the first proton of the polyvalent acid.

By blending such a compound, the cyclization reaction of the polyimide precursor can be carried out at a low temperature, and a composition with more excellent stability can be obtained. In addition, since the thermal-base generator does not generate a base in a case of being not heated, the cyclization of the polyimide precursor during storage can be suppressed even in the presence of the polyimide precursor, which leads to excellent storage stability.

The thermal-base generator of the present invention includes at least one type selected from an acidic compound (A1) which generates a base in a case of being heated to 40° C. or higher, or an ammonium salt (A2) which has an ammonium cation and anion of which the pKa1 is 0 to 4.

The acidic compound (A1) and the ammonium salt (A2) generate a base in a case of being heated. Thus, the base generated from these compounds makes it possible to promote a cyclization reaction of the polyimide precursor, and makes it possible to cause cyclization of the polyimide precursor to be carried out at a low temperature. In addition, even in a case where these compounds are caused to coexist with a polyimide precursor which is cyclized by a base and cured, cyclization of the polyimide precursor hardly proceeds unless heated, so that a polyimide precursor having excellent stability can be prepared.

The acidic compound of the present specification means a compound having a pH value measured by a pH meter at 20° C. is 7 or lower in a case where 1 g of the compound is taken in a container and 50 mL of mixed solution of deionized water and tetrahydrofuran (mass ratio is water/tetrahydrofuran=1/4) is added to the compound, and the solution is stirred for an hour at room temperature.

In the present invention, a base generation temperature of the acidic compound (A1) and the ammonium salt (A2) is preferably 40° C. or higher, and more preferably 120° C. to 200° C. The upper limit of the base generation temperature is preferably 190° C. or lower, more preferably 180° C. or lower, and even more preferably 165° C. or lower. The lower limit of the base generation temperature is preferably 130° C. or higher, and more preferably 135° C. or higher.

In a case where the base generation temperature of the acidic compound (A1) and ammonium salt (A2) is 120° C. or higher, since the base is hardly generated during storage, the polyimide precursor having excellent stability can be prepared. In a case where the base generation temperature of the acidic compound (A1) and the ammonium salt (A2) is 200° C. or lower, a cyclization temperature of the polyimide precursor can be decreased. The base generation temperature may be measured, for example, using differential scanning calorimetry by heating a compound to 250° C. at a rate of 5° C./min in a pressure-resistant capsule, reading a peak temperature of an exothermic peak showing the lowest temperature, and taking the peak temperature as a base generation temperature.

In the present invention, a base generated by the thermal-base generator is preferably a secondary amine or a tertiary amine, and more preferably a tertiary amine. Since the tertiary amine is highly basic, the cyclization temperature of the polyimide precursor can be further reduced. In addition, a boiling point of the base generated by the thermal-base generator is preferably 80° C. or higher, more preferably 100° C. or higher, and even more preferably 140° C. or higher. In addition, a molecular weight of the generated base is preferably 80 to 2,000. The lower limit thereof is more preferably 100 or higher. The upper limit thereof is more preferably 500 or lower. A value of the molecular weight is a theoretical value obtained from a structural formula.

In the present invention, the acidic compound (A1) preferably contains one or more types selected from an ammonium salt and a salt formed between either of cations represented by Formula (101) or (102) described later and an anion. The anion may be bound to a part of either ammonium cation via a covalent bond, or may be an external component of the ammonium cation, wherein it is preferably an external component of the ammonium cation. The phrase stating that "anion is an external component of the ammonium cation" means that the ammonium cation and the anion are not bound via a covalent bond. The anion, which is an external component of cation, will occasionally be referred to as counter anion.

Formula (101)

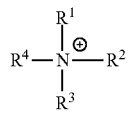

-continued

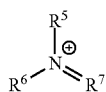

Formula (102)

In Formulae, each of $R^1$ to $R^6$ independently represents a hydrogen atom or hydrocarbon group, and $R^7$ represents a hydrocarbon group. Each pair of $R^1$ and $R^2$; $R^3$ and $R^4$; $R^5$ and $R^6$; and $R^5$ and $R^7$ may combine to form a ring.

In the present invention, the ammonium salt (A2) is preferably an acidic compound. The ammonium salt (A2) may be a compound containing an acidic compound which generates a base in a case of being heated to 40° C. or higher (preferably 120° C. to 200° C.), or may be a compound other than the acidic compound which generates a base in a case of being heated to 40° C. or higher (preferably 120° C. to 200° C.). With regard to details thereof, reference can be made to the description of WO2016/194769A, the content of which is incorporated herein.

In a case where the thermal-base generator is used, the content of the thermal-base generator in the photosensitive resin composition is preferably 0.1% to 50% by mass with respect to the total solid content of the composition. The lower limit thereof is more preferably, 0.5% by mass or higher, and still more preferably 1% by mass or higher. The upper limit thereof is more preferably 30% by mass or lower, and even more preferably 20% by mass or lower.

For the thermal-base generator, one type or two or more types may be used. In a case where two or more types are used, a total amount is preferably within the above-mentioned range.

<<<Photo-Base Generator>>>

The photosensitive resin composition used in the embodiment of the present invention may contain a photo-base generator. The photo-base generator generates a base by exposure and does not show activity under normal conditions of normal temperature and pressure. The photo-base generator is not particularly limited as long as it generates the base (basic substance) in a case where irradiation with electromagnetic waves and heating are performed as external stimuli. Since the base generated by the exposure acts as a catalyst for curing the polyimide precursor by heating, the base can be suitably used in a case where negative tone development treatment is performed.

In the present invention, a known photo-base generator can be used. For example, as described in M. Shirai, and M. Tsunooka, Prog. Polym. Sci., 21, 1 (1996); Masahiro Tsukaoka, polymer processing, 46, 2 (1997); C. Kutal, Coord. Chem. Rev., 211, 353 (2001); Y. Kaneko, A. Sarker, and D. Neckers, Chem. Mater., 11, 170 (1999); H. Tachi, M. Shirai, and M. Tsunooka, J. Photopolym. Sci. Technol., 13, 153 (2000); M. Winkle, and K. Graziano, J. Photopolym. Sci. Technol., 3, 419 (1990); M. Tsunooka, H. Tachi, and S. Yoshitaka, J. Photopolym. Sci. Technol., 9, 13 (1996); K. Suyama, H. Araki, M. Shirai, J. Photopolym. Sci. Technol., 19, 81 (2006), a transition metal compound complex, a compound having a structure such as an ammonium salt, an ionic compound, such as a compound in which an amidine moiety is latent by forming a salt with carboxylic acid, of which the base component forms a salt so as to be neutralized, and a non-ionic compound in which base component is latent by a urethane bond such as acyl compound or oxime bond such as carbamate derivatives, oxime ester derivatives are exemplified.

The basic substance generated from the photo-base generator is not particularly limited, and compounds having an amino group, particularly monoamines, polyamines such as diamines, and amidines are exemplified.

The generated basic substance is preferably a compound having a more highly basic amino group. This is because the catalytic action on the dehydration condensation reaction and the like in the imidization of the polyimide precursor is strong, and the addition of a smaller amount makes it possible to exhibit the catalytic effect in the dehydration condensation reaction and the like at a lower temperature. That is, since the catalytic effect of the generated basic substance is large, the apparent sensitivity as a negative type photosensitive resin composition is improved.

From the viewpoint of the above-described catalytic effect, the photo-base generator preferably contains amidine and aliphatic amine.

The photo-base generator used in the present invention is preferably a compound containing an aromatic ring and a compound in which the generated basic substance has an amino group.

As the photo-base generator according to the present invention, for example, a photo-base generator having a cinnamic acid amide structure as disclosed in JP2009-080452A and WO2009/123122A, a photo-base generator having a carbamate structure as disclosed in JP2006-189591A and JP2008-247747A, a photo-base generator having an oxime structure or a carbamoyl oxime structure disclosed in JP2007-249013A and JP2008-003581A, and the like are mentioned, but not limited to thereto. In addition, the structure of a known photo-base generator may be used.

In addition, as the photo-base generator, compounds described in paragraphs 0185 to 0188, 0199, 0200 and 0202 of JP2012-093746A, compounds described in paragraphs 0022 to 0069 of JP2013-194205A, compounds described in paragraphs 0026 to 0074 of JP2013-204019A, and the compounds described in paragraph 0052 of WO2010/064631A are mentioned as examples.

As commercially available products of photo-base generators, WPBG-266, WPBG-300, WPGB-345, WPGB-140, WPBG-165, WPBG-027, PBG-018, WPGB-015, WPBG-041, WPGB-172, WPGB-174, WPBG-166, WPBG-158, WPGB-025, WPGB-168, WPGB-167 and WPBG-082 (manufactured by Wako Pure Chemical Industries, Co., Ltd.) can also be used.

Additionally, the following compounds are exemplified as a photo-base generator.

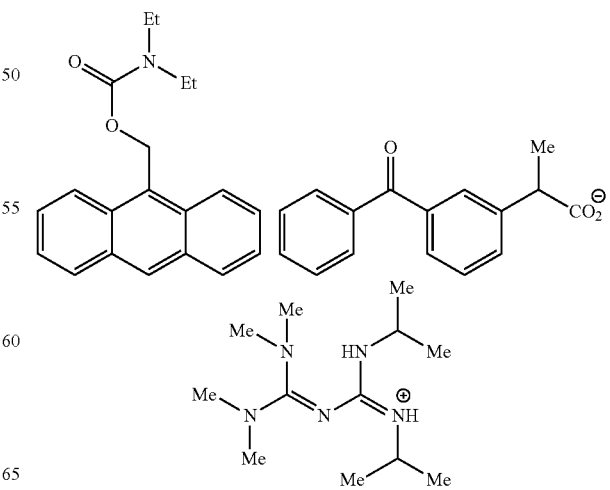

In a case where the photo-base generator is used, the content of the photo-base generator in the photosensitive resin composition is preferably 0.1% to 50% by mass with respect to the total solid content of the composition. The lower limit thereof is more preferably 0.5% by mass or higher, and still more preferably 1% by mass or higher. The upper limit thereof is more preferably 30% by mass or lower, and even more preferably 20% by mass or lower.

For the photo-base generator, one type or two or more types may be used. In a case where two or more types are used, a total amount is preferably within the above-mentioned range.

<<Other Additives>>

Various additives, for example, a thermal-acid generator, a sensitizing agent, a chain transfer agent, a surfactant, a higher fatty acid derivative, an inorganic particle, a curing agent, a curing catalyst, a filler, an antioxidant, an ultraviolet absorbent, and an aggregation inhibitor can be blended, if necessary, with the photosensitive resin composition according to the embodiment of the present invention to the extent that an effect of the present invention is not impaired. In a case where these additives are blended, a total blending amount thereof is preferably 3% by mass or lower of the solid content of the composition.

<<<Thermal-Acid Generator>>>

The photosensitive resin composition according to the embodiment of the present invention may contain a thermal-acid generator. The thermal-acid generator generates an acid by heating, and promotes cyclization of the polyimide precursor, so that mechanical properties of a cured film are further improved. For the thermal-acid generator, compounds described in paragraph 0059 of JP2013-167742A are mentioned.

A content of the thermal-acid generator is preferably 0.01 parts by mass or higher, and more preferably 0.1 parts by mass or higher, with respect to 100 parts by mass of the polyimide precursor. In a case where the thermal-acid generator is contained in an amount of 0.01 parts by mass or higher, crosslinking reaction and cyclization of the polyimide precursor are promoted, so that mechanical properties and chemical resistance of the cured film can be further improved. In addition, the content of the thermal-acid generator is preferably 20 parts by mass or lower, more preferably 15 parts by mass or lower, and particularly preferably 10 parts by mass or lower, from the viewpoint of electrical insulation of the cured film.

For the thermal-acid generator, only one type may be used, or two or more types may be used. In a case where two or more types are used, a total amount is preferably within the above-mentioned range.

<<<Sensitizing Agent>>>

The photosensitive resin composition according to the embodiment of the present invention may contain a sensitizing agent. The sensitizing agent absorbs a specific actinic radiation and becomes an electronically excited state. The sensitizing agent in the electronically excited state is brought into contact with a thermal-base generator, a thermal-radical polymerization initiator, a photo-radical polymerization initiator, or the like, to cause actions such as electron transfer, energy transfer, and heat generation. As a result, the thermal-base generator, the thermal-radical polymerization initiator, or the photo-radical polymerization initiator undergoes a chemical change and decomposes, so that radicals, acids, or bases are generated. For details of the sensitizing agent other than the sensitizing agent used in examples as described later, reference can be made to the description in paragraphs 0161 to 0163 of JP2016-027357A, the content of which is incorporated herein.

In a case where the photosensitive resin composition according to the embodiment of the present invention contains a sensitizing agent, the content of the sensitizing agent is preferably 0.01% to 20% by mass, with respect to the total solid content of the photosensitive resin composition according to the embodiment of the present invention, more preferably, 0.1% to 15% by mass, and still more preferably 0.5% to 10% by mass. For the sensitizing agent, one type may be used alone, or two or more types may be used in combination. In a case where two or more types are blended, a total amount is preferably within the above-mentioned range.

<<<Chain Transfer Agent>>>

The photosensitive resin composition according to the embodiment of the present invention may contain a chain transfer agent. The chain transfer agent is defined, for example, in Polymer Dictionary, 3rd Edition, pages 683 and 684 (edited by The Society of Polymer Science, 2005). As the chain transfer agent, for example, a group of compounds having SH, PH, SiH, or GeH in a molecule is used. These can donate a hydrogen to a low active radical to generate a radical, or can be oxidized and then deprotonated to generate a radical. In particular, thiol compounds (for example, 2-mercaptobenzimidazoles, 2-mercaptobenzothiazoles, 2-mercaptobenzoxazoles, 3-mercaptotriazoles, and 5-mercaptotetrazoles) can be preferably used.

In a case where the photosensitive resin composition according to the embodiment of the present invention has the chain transfer agent, the content of the chain transfer agent is preferably 0.01 to 20 parts by mass, more preferably 1 to 10 parts by mass, and even more preferably 1 to 5 parts by mass, with respect to 100 parts by mass of the total solid content of the photosensitive resin composition according to the embodiment of the present invention. For the chain transfer agent, only one type may be used, or two or more types may be used. In a case where two or more types of chain transfer agents are used, a total thereof is preferably within the above-mentioned range.

<<<Surfactant>>>

From the viewpoint of further improving the coating property, each kind of surfactant may be added to the photosensitive resin composition according to the embodiment of the present invention. As the surfactant, various types of surfactants such as a fluorine-based surfactant, a nonionic surfactant, a cationic surfactant, an anionic surfactant, and a silicone-based surfactant can be used. In addition, the following surfactant is preferably used.

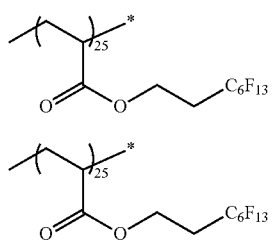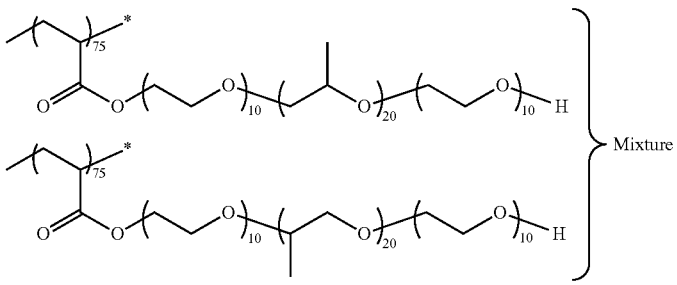

In a case where the photosensitive resin composition according to the embodiment of the present invention has a surfactant, the content of the surfactant is preferably 0.001% to 2.0% by mass, with respect to the total solid content of the photosensitive resin composition according to the embodiment of the present invention, and more preferably 0.005% to 1.0% by mass. For the surfactant, only one type may be used, or two or more types may be used. In a case where two or more types of surfactants are used, a total thereof is preferably within the above-mentioned range.

<<<Higher Fatty Acid Derivative>>>

In the photosensitive resin composition according to the embodiment of the present invention, in order to prevent polymerization inhibition due to oxygen, a higher fatty acid derivative such as behenic acid or behenic acid amide is added and is caused to be localized on a surface of the composition in the course of drying after coating.

In a case where the photosensitive resin composition according to the embodiment of the present invention has a higher fatty acid derivative, the content of the higher fatty acid derivative is preferably 0.1% to 10% by mass with respect to the total solid content of the photosensitive resin composition according to the embodiment of the present invention. For the higher fatty acid derivative, only one type may be used, or two or more types may be used. In a case where two or more higher fatty acid derivatives are used, a total thereof is preferably within the above-mentioned range.

<<Restriction on Other Substances to be Contained>>

A water content of the photosensitive resin composition according to the embodiment of the present invention is preferably less than 5% by mass, more preferably less than 1% by mass, and particularly preferably less than 0.6% by mass, from the viewpoint of properties of a coated surface.

From the viewpoint of insulating properties, the metal content of the photosensitive resin composition according to the embodiment of the present invention is preferably less than 5 parts per million (ppm) by mass, more preferably less than 1 ppm by mass, and particularly preferably less than 0.5 ppm by mass. As the metal, sodium, potassium, magnesium, calcium, iron, chromium, nickel, and the like are mentioned. In a case where a plurality of metals are contained, a total of these metals is preferably within the above-mentioned range.

In addition, as a method of reducing metal impurities which are unintentionally contained in the photosensitive resin composition according to the embodiment of the present invention, a method of selecting a raw material which contains a low metal content as the raw material constituting the photosensitive resin composition according to the embodiment of the present invention, a method of filtering the raw material constituting the photosensitive resin composition according to the embodiment of the present invention, a method of distilling under the condition in which the inside of the device is lined with polytetrafluoroethylene or the like to suppress the contamination as little as possible, and the like can be mentioned.

In the photosensitive resin composition according to the embodiment of the present invention, a content of halogen atoms is preferably less than 500 ppm by mass, more preferably less than 300 ppm by mass, and particularly preferably less than 200 ppm by mass, from the viewpoint of wiring corrosiveness. Among these, in a case of being present in a halogen ion state, the content is preferably less than 5 ppm by mass, more preferably less than 1 ppm by mass, and even more preferably less than 0.5 ppm by mass. As the halogen atom, a chlorine atom and a bromine atom are mentioned. It is preferable that each of the chlorine atom and the bromine atom, or a total of the chlorine ion and the bromine ion is within the above-mentioned range.

As a storage container for the photosensitive resin composition according to the embodiment of the present invention, storage containers known in the related art can be used. In addition, as the storage container, for the purpose of suppressing incorporation of impurities into raw materials and the composition, a multilayer bottle in which an inner wall of a container is composed of six types of six layers of resin, and a bottle with six types of resin being made as a seven-layer structure are preferably used. As such a container, for example, the container described in JP2015-123351A can be mentioned.

<<Preparation of Composition>>

The photosensitive resin composition according to the embodiment of the present invention can be prepared by mixing the above-mentioned components. A mixing method is not particularly limited, and mixing can be carried out by methods known in the related art.

In addition, for the purpose of removing foreign substances such as dust and fine particles in the composition, it is preferable to carry out filtration using a filter. A filter pore size is preferably 1 μm or lower, more preferably 0.5 μm or lower, and even more preferably 0.1 μm or lower. A material of the filter is preferably polytetrafluoroethylene, polyethylene, or nylon. As the filter, a filter which has been previously washed with an organic solvent may be used. In a filtration step using a filter, a plurality of types of filters may be connected in series or in parallel and used. In a case where a plurality of types of filters are used, filters having different pore sizes and/or different materials may be used in combination. In addition, various materials may be filtered a plurality of times. In a case of being filtered a plurality of times, circulation filtration may be used. In addition, filtration may be carried out under pressure. In a case where filtration is carried out under pressure, the pressure is preferably 0.05 MPa to 0.3 MPa.

In addition to filtration using a filter, impurity removal treatment using an adsorbing material may be carried out.

The filtration using a filter and the impurity removal treatment using an adsorbing material may be combined. As the adsorbing material, a known adsorbing material can be used. For example, an inorganic adsorbing material such as silica gel and zeolite, and an organic adsorbing material such as activated carbon are mentioned.

<Cured Film, Semiconductor Device, Method for Producing Cured Film, Method for Producing Laminate, and Method for Producing Semiconductor Device>

Next, a cured film, a semiconductor device, a method for producing a cured film, a method for producing a laminate, and a method for producing a semiconductor device according to the embodiment of the present invention will be described.

The cured film according to the embodiment of the present invention is formed by curing the photosensitive resin composition according to the embodiment of the present invention. A film thickness of the cured film according to the embodiment of the present invention can be, for example, 0.5 µm or higher, and 1 µm or higher. In addition, the upper limit value thereof can be 100 µm or lower, and can be 30 µm or lower.

Two or more layers of the cured film of the embodiment of the present invention may be laminated to form a laminate. A laminate having two or more layers of the cured film of the present invention preferably has a metal layer between the cured films. Such a metal layer is preferably used as a metal wiring such as a re-distribution layer.

As a field to which the cured film of the present invention can be applied, an insulating film of a semiconductor device, an interlayer insulating film for a re-distribution layer, and the like are mentioned. In particular, due to good resolution properties, the cured film of the present invention can be preferably used for an interlayer insulating film for a re-distribution layer in a three-dimensional mounting device.

In addition, the cured film according to the embodiment of the present invention can also be used for photoresist for electronics, galvanic (electrolytic) resist, etching resist, solder top resist, and the like.

In addition, the cured film according to the embodiment of the present invention can also be used for production of board surfaces such as an offset board surface or a screen board surface, for etching of molded parts, for production of protective lacquers and dielectric layers in electronics, in particular, microelectronics, and the like.

The method for producing a cured film according to the embodiment of the present invention includes using the photosensitive resin composition according to the embodiment of the present invention. Preferably, a method for producing a cured film which has a photosensitive resin composition layer forming step of applying the photosensitive resin composition according to the embodiment of the present invention to a substrate to form a layer, an exposure step of exposing the photosensitive resin composition layer, and a development treatment step of subjecting the exposed photosensitive resin composition layer (resin layer) to a development treatment is mentioned. The photosensitive resin composition according to the embodiment of the present invention is preferably used in the case of performing negative tone development.

The method for producing a laminate of the embodiment of the present invention includes a method for producing a cured film of the embodiment of the present invention. The method for producing a laminate of the embodiment of the present invention preferably includes forming a cured film in accordance with the method for producing a cured film of the present invention, and then further performing the photosensitive resin composition layer forming step, the exposure step, and the development treatment step, in this order. In particular, it is preferable that the photosensitive resin composition layer forming step, the exposure step, and the development treatment step are further carried out, in this order, 2 to 5 times (that is, 3 to 6 times in total). By laminating the cured film in this manner, a laminate can be obtained. In the present invention, in particular, it is preferable to provide a metal layer on a portion which has been developed and removed, after the cured film is provided and developed.

The details thereof will be described below.

<<Photosensitive Resin Composition Layer Forming Step>>

The method for producing a laminate according to the embodiment of the present invention includes a photosensitive resin composition layer forming step of applying a photosensitive resin composition to a substrate to form a layer.

The type of substrate can be appropriately determined depending on the application, such as a semiconductor production substrate such as silicon, silicon nitride, polysilicon, silicon oxide, or amorphous silicon, quartz, glass, an optical film, a ceramic material, a vapor deposited film, magnetic film, a metal substrate such as Ni, Cu, Cr, or Fe, paper, a spin on glass (SOG), a thin film transistor (TFT) array substrate, and an electrode plate of a plasma display panel (PDP), and is not particular limited thereto. In the present invention, in particular, the semiconductor production substrate is preferable, and the silicon substrate is more preferable.

In a case where the photosensitive resin composition layer is formed on a surface of a resin layer or on a surface of the metal layer, the resin layer or the metal layer is the substrate.

As a means to apply the photosensitive resin composition to the substrate, coating is preferable.

Specifically, as means for application, a dip coating method, an air knife coating method, a curtain coating method, a wire bar coating method, a gravure coating method, an extrusion coating method, a spray coating method, a spin coating method, a slit coating method, and an inkjet method are exemplified. From the viewpoint of uniformity of the thickness of the photosensitive resin composition layer, the spin coating, the slit coating, the spray coating, and the inkjet are more preferable. A resin layer having a desired thickness can be obtained by appropriately adjusting a concentration of the solid content and application conditions according to the method. In addition, the coating method can be appropriately selected depending on the shape of the substrate. In a case where a circular substrate such as a wafer is used, the spin coating method, the spray coating method, the ink jet method, and the like are preferable, and in a case where a rectangular substrate is used, the slit coating method, the spray coating method, the ink jet method, and the like are preferable. For example, the spin coating method can be applied at a rotational speed of 500 to 2000 rpm for about 10 seconds to 1 minute.

<<Drying Step>>

The method for producing a laminate according to the embodiment of the present invention may include a step of drying to remove the solvent after forming the photosensitive resin composition layer. A preferred drying temperature is 50° C. to 150° C., more preferably 70° C. to 130° C., and even more preferably 90° C. to 110° C. A drying time is, for example, 30 seconds to 20 minutes, preferably 1 minute to 10 minutes, and more preferably 3 minutes to 7 minutes.

<<Exposure Step>>

The method for producing the laminate according to the embodiment of the present invention includes an exposure step of exposing the photosensitive resin composition layer. The amount of exposure is not particularly limited as long as the photosensitive resin composition can be cured, and for example, irradiation with 100 to 10000 mJ/cm$^2$ is preferable, and irradiation with 200 to 8000 mJ/cm$^2$ is more preferable, in terms of conversion of exposure energy at a wavelength of 365 nm.

The exposure wavelength can be appropriately determined in the range of 190 to 1000 nm, preferably 240 to 550 nm.

<<Development Treatment Step>>

The method for producing the laminate according to the embodiment of the present invention includes a development treatment step of performing negative tone development treatment on the exposed photosensitive resin composition layer. By performing negative tone development, an unexposed portion (non-exposed portion) is removed. The development method is not particularly limited as long as the development method can form a desired pattern, and, for example, a development method such as paddle, spray, immersion, and ultrasonic waves can be employed.

Development is performed using a developer. The developer can be used without particular limitation as long as the unexposed portion (non-exposed portion) is removed. The developer preferably contains an organic solvent. The organic solvents, for example, esters such as ethyl acetate, n-butyl acetate, amyl formate, isoamyl acetate, isobutyl acetate, butyl propionate, isopropyl butyrate, ethyl butyrate, butyl butyrate, methyl lactate, ethyl lactate, γ-butyrolactone, ε-caprolactone, δ-valerolactone, alkyl oxyacetate (example: methyl alkyl oxyacetate, ethyl alkyl oxy acetate, butyl alkyl oxy acetate (for example, methyl methoxy acetate, ethyl methoxy acetate, butyl methoxy acetate, methyl ethoxy acetate, ethyl ethoxyacetate, and the like)), 3-alkyloxypropionic acid alkyl esters (example: methyl 3-alkyloxypropionate, ethyl 3-alkyloxypropionate or the like (for example, methyl 3-methoxypropionate, ethyl 3-methoxypropionate), methyl 3-ethoxypropionate, ethyl 3-ethoxypropionate, and the like)), 2-alkyloxypropionic acid alkyl esters (example: methyl 2-alkyloxypropionate, ethyl 2-alkyloxypropionate, propyl 2-alkyl oxypropionate or the like (for example, methyl 2-methoxypropionate, ethyl 2-methoxypropionate, propyl 2-methoxypropionate, methyl 2-ethoxypropionate, ethyl 2-ethoxypropionate)), methyl 2-alkyloxy-2-methylpropionate and ethyl 2-alkyloxy-2-methylpropionate (for example, methyl 2-methoxy-2-methylpropionate, ethyl 2-ethoxy-2-methylpropionate, and the like), methyl pyruvate, ethyl pyruvate, propyl pyruvate, methyl acetoacetate, ethyl acetoacetate, methyl 2-oxobutanoate, ethyl 2-oxobutanoate, and the like, and ethers, for example, such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, and the like, and ketones, for example, such as methyl ethyl ketone, cyclohexanone, cyclopentanone, 2-heptanone, 3-heptanone, N-methyl-2-pyrrolidone, and the like, and aromatic hydrocarbons, for example, such as toluene, xylene, anisole, limonene, and the like, and sulfoxides such as dimethyl sulfoxide are suitably mentioned.

In the present invention, cyclopentanone and γ-butyrolactone are particularly preferable, and cyclopentanone is more preferable.

The development time is preferably 10 seconds to 5 minutes. The temperature at the time of development is not particularly limited, and the development can usually be performed at 20° C. to 40° C.

After treating with the developer, a rinsing may be further performed. The rinsing is preferably performed with a solvent different from the developer. For example, the rinsing can be performed using the solvent contained in the photosensitive resin composition. The rinsing time is preferably 5 seconds to 1 minute.

<<Heating Step>>

The method for producing the laminate according to the embodiment of the present invention preferably includes a heating step. In the heating step, a cyclization reaction of the polyimide precursor proceeds. In addition, in a case where the photosensitive resin composition according to the embodiment of the present invention contains a radically polymerizable compound, curing of a radically polymerizable compound which is not reacted also proceeds. The heating temperature (maximum heating temperature) is preferably 50° C. to 450° C., more preferably 140° C. to 400° C., and even more preferably 160° C. to 350° C.

The heating is preferably performed at a temperature elevation rate of 1 to 12° C./min from the temperature at the start of heating to the maximum heating temperature, more preferably 2 to 10° C./min, and even more preferably 3 to 10° C./min. By setting the temperature elevation rate to 1° C./min or higher, excessive volatilization of the amine can be prevented while securing productivity, and by setting the temperature elevation rate to 12° C./min or lower, residual stress of the cured film can be relieved.

The temperature at the start of heating is preferably 20° C. to 150° C., more preferably 20° C. to 130° C., and even more preferably 25° C. to 120° C. The temperature at the start of heating refers to a temperature at which the step of heating to the maximum heating temperature is started. For example, in a case where the photosensitive resin composition is applied on a substrate and then dried, the temperature at the start of heating is the temperature after drying, and for example, it is preferable to gradually raise the temperature which is lower by 30° C. to 200° C. than the boiling point of the solvent contained in the photosensitive resin composition.

The heating time (heating time at the maximum heating temperature) is preferably 10 to 360 minutes, more preferably 20 to 300 minutes, and particularly preferably 30 to 240 minutes.

Particularly, in the case of forming a multilayer laminate, the heating is preferably performed at 180° C. to 320° C., and more preferably 180° C. to 260° C., from the viewpoint of adhesiveness between the cured films. Although the reason is not clear, it is considered that, at this temperature, the ethynyl groups of the polyimide precursor between layers mutually undergo a crosslinking reaction.

The heating may be performed stepwise. As an example, a pretreatment step may be performed, in which the temperature is raised from 25° C. to 180° C. at 3° C./min, held at 180° C. for 60 minutes, raised from 180° C. to 200° C. at 2° C./min, held at 200° C. for 120 minutes, and the like may be performed. The heating temperature as the pretreatment step is preferably 100° C. to 200° C., more preferably 110° C. to 190° C., and even more preferably 120° C. to 185° C. In the pretreatment step, it is also preferable to perform the treatment while irradiating with ultraviolet ray as described in U.S. Pat. No. 9,159,547B. By such a pretreatment step, it is possible to improve the properties of the film. The pretreatment step may be performed for a short time of about 10 seconds to two hours, and more preferably 15 seconds to 30 minutes. The pretreatment may be performed in two or more steps, for example, the pretreatment step 1 may be performed in the range of 100° C. to 150° C., and then the pretreatment step 2 may be performed in the range of 150° C. to 200° C.

Furthermore, it may be cooled after heating, and the cooling rate in this case is preferably 1 to 5° C./min.

It is preferable that the heating step is performed in an atmosphere of low oxygen concentration by flowing an inert gas such as nitrogen, helium, argon or the like, from the viewpoint of preventing the decomposition of the polyimide precursor. The oxygen concentration is preferably 50 ppm (volume ratio) or lower, and more preferably 20 ppm (volume ratio) or lower.

<<Metal Layer Forming Step>>

It is preferable that the method for producing the laminate according to the embodiment of the present invention includes a metal layer forming step of forming a metal layer on the surface of the photosensitive resin composition layer after development treatment.

As the metal layer, while existing metal types can be used without particular limitation, copper, aluminum, nickel, vanadium, titanium, chromium, cobalt, gold and tungsten are exemplified, copper and aluminum are more preferable, and copper is even more preferable.

The method of forming the metal layer does not have a particular limitation, and the existing method can be applied. For example, the methods disclosed in JP2007-157879A, JP2001-521288A, JP2004-214501A, and JP2004-101850A can be used. For example, photolithography, lift-off, electrolytic plating, electroless plating, etching, printing, and methods combining these may be considered. More specifically, examples of the method of forming the metal layer may include a patterning method combining sputtering, photolithography and etching, and a patterning method combining photolithography and electrolytic plating.

The thickness of the metal layer is preferably 0.1 to 50 μm, and more preferably 1 to 10 μm at the thickest part.

<<Laminating Step>>

The production method according to the embodiment of the present invention preferably further includes a laminating step.

The laminating step is a series of steps including performing the photosensitive resin composition layer forming step, the exposure step, and the development treatment step in this order. The laminating step may further include the above-mentioned drying step, heating step, and the like.

In a case where the laminating step is further performed after the laminating step, a surface activation treatment step may be further performed after the exposure step or the metal layer forming step. Plasma treatment is exemplified as the surface activation treatment.

The laminating step is preferably performed 2 to 5 times, and more preferably 3 to 5 times.

For example, a configuration having 3 to 7 resin layers such as a resin layer/a metal layer/a resin layer/a metal layer/a resin layer/a metal layer is preferable, and a configuration having 3 to 5 resin layers is more preferable.

That is, particularly in the present invention, it is preferable that the photosensitive resin composition layer forming step, the exposure step, and the development treatment step are further performed in this order so as to cover the metal layer, after the metal layer is provided. By alternately performing the laminating step of laminating the photosensitive resin composition layer (resin) and the metal layer forming step, the photosensitive resin composition layer (resin layer) and the metal layer can be alternately laminated.

In the present invention, a semiconductor device having the cured film or the laminate according to the embodiment of the present invention is also disclosed. As a specific example of a semiconductor device using the photosensitive resin composition according to the embodiment of the present invention, for forming an interlayer insulating film for a re-distribution layer, reference can be made to the description in paragraphs 0213 to 0218 and the description of FIG. 1 of JP2016-027357A can be referred, the content of which is incorporated herein.

EXAMPLES

Hereinafter, the present invention will be described more specifically with reference to examples. Materials, amounts used, proportions, treatment details, treatment procedures, and the like shown in the following examples can be appropriately changed without departing from the gist of the present invention. Accordingly, a scope of the present invention is not limited to the following specific examples. "Parts" and "%" are on a mass basis unless otherwise stated.

Synthesis Example 1

77.6 g of 4,4'-oxydiphthalic acid dianhydride and 73.6 g of 3,3',4,4'-biphenyl tetracarboxylic acid dianhydride were placed into a separable flask, and then 131.2 g of 2-hydroxyethyl methacrylate (HEMA) and 400 mL of γ-butyrolactone were added to the mixture, and the mixture was stirred at room temperature, further, 81.5 g of pyridine was added to the mixture while stirring to obtain a reaction mixture. After the end of reaction heat, the reaction mixture was allowed to cool to room temperature and left for 16 hours. Next, under ice-cooling, a solution obtained by dissolving 206.3 g of dicyclohexylcarbodiimide (DCC) in 180 mL of γ-butyrolactone was added to the reaction mixture while stirring over 40 minutes, and subsequently, a suspension obtained by suspending 93.0 g of 4,4'-diaminodiphenyl ether (DADPE) in 350 mL of γ-butyrolactone was added to the reaction mixture while stirring over 60 minutes. After further stirring at room temperature for two hours, 30 mL of ethyl alcohol was added and the reaction mixture was stirred for one hour, and then 400 mL of γ-butyrolactone was added. The sediment formed in the reaction mixture was removed by filtration to obtain a reaction solution. The obtained reaction solution was added to three liters of ethyl alcohol to produce a sediment consisting of crude polymer. The resulting crude polymer was separated by filtration and dissolved in 1.5 liters of tetrahydrofuran to obtain a crude polymer solution. The obtained crude polymer solution was added dropwise to 28 liters of water to sediment the polymer, and the obtained sediment was separated by filtration, and then vacuum drying was performed to obtain a powdery polymer (polyimide precursor P-1). The weight-average molecular weight (Mw) of the polyimide precursor P-1 was measured by gel permeation chromatography (in terms of standard polystyrene) to be 27000.

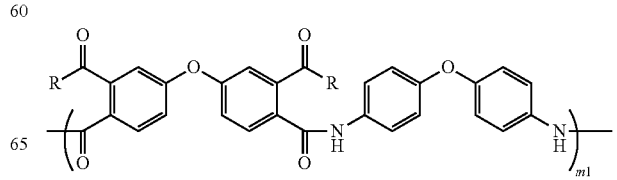

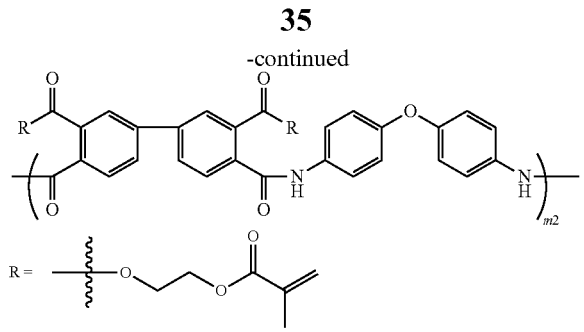

A molar ratio of m1 to m2 is 50:50.

Synthesis Example 2

Polyimide precursor P-2 was obtained in the same manner as in Synthesis Example 1, except that the amount of 4,4'-oxydiphthalic acid dianhydride was changed to 62.1 g and the amount of 3,3',4,4'-biphenyl tetracarboxylic acid was changed to 88.3 g.

Synthesis Example 3

Polyimide precursor P-3 was obtained in the same manner as in Synthesis Example 1, except that the amount of 4,4'-oxydiphthalic acid dianhydride was changed to 93.1 g of and the amount of 3,3',4,4'-biphenyl tetracarboxylic acid was changed to 58.9 g.

Synthesis Example 4

Polyimide precursor P-4 was obtained in the same manner as in Synthesis Example 1, except that the amount of 4,4'-oxydiphthalic acid dianhydride was changed to 46.6 g and 3,3',4,4'-biphenyl tetracarboxylic acid was changed to 103.0 g.

Synthesis Example 5

Polyimide precursor P-5 was obtained in the same manner as in Synthesis Example 1, except that the amount of 4,4'-oxydiphthalic acid dianhydride was changed to 108.6 g and the amount of 3,3',4,4'-biphenyl tetracarboxylic acid was changed to 44.2 g.

Synthesis Example 6

Polyimide precursor P-6 was obtained in the same manner as in Synthesis Example 1, except that the amount of 77.6 g of 4,4'-oxydiphthalic acid dianhydride and 73.6 g of 3,3',4,4'-biphenyl tetracarboxylic acid dianhydride were changed to the amount of 147.2 g of 3,3',4,4'-biphenyl tetracarboxylic acid only.

Synthesis Example 7

Polyimide precursor P-7 was obtained in the same manner as in Synthesis Example 1, except that the amount of 77.6 g of 4,4'-oxydiphthalic acid dianhydride and 73.6 g of 3,3',4,4'-biphenyl tetracarboxylic acid dianhydride were changed to the amount of 155.2 g of 4,4'-oxydiphthalic acid only.

Synthesis Example 8

The same synthesis was performed in the same manner as in Synthesis Example 1 until the reaction step. The obtained reaction solution was added to 1 Liter of ethyl alcohol to produce a sediment consisting of crude polymer except a step of adding the reaction solution to 3 Liters of ethyl alcohol to produce a sediment consisting of crude polymer. The subsequent steps were performed in the same manner as in Synthesis Example 1 to obtain P-8.

Synthesis Example 9

The same synthesis was performed in the same manner as in Synthesis Example 1 until the reaction of adding DCC. Next, a suspension obtained by suspending 95.0 g of 4,4'-diaminodiphenyl ether (DADPE) in 350 mL of γ-butyrolactone was added to the reaction mixture while stirring over 60 minutes except a step of adding a suspension obtained by suspending 93.0 g of 4,4'-diaminodiphenyl ether (DADPE) in 350 mL of γ-butyrolactone to the reaction mixture while stirring over 60 minutes. The subsequent steps were performed in the same manner as in Synthesis Example 1 to obtain P-9.

Synthesis Example 10

The same synthesis was performed in the same manner as in Synthesis Example 1 until the reaction of adding DCC. Next, a suspension obtained by suspending 88.0 g of 4,4'-diaminodiphenyl ether (DADPE) in 350 mL of γ-butyrolactone was added to the reaction mixture while stirring over 60 minutes except a step of adding a suspension of 93.0 g of 4,4'-diaminodiphenyl ether (DADPE) in 350 mL of γ-butyrolactone to the reaction mixture while stirring over 60 minutes. The subsequent steps were performed in the same manner as in Synthesis Example 1 to obtain P-10.

Synthesis Example 11

The same synthesis was performed in the same manner as in Synthesis Example 1 until the reaction of adding DCC. Next, a suspension obtained by suspending 93.0 g of 4,4'-diaminodiphenyl ether (DADPE) in 350 mL of γ-butyrolactone was added to the reaction mixture while stirring over 20 minutes except a step of adding a suspension of 93.0 g of 4,4'-diaminodiphenyl ether (DADPE) in 350 mL of γ-butyrolactone to the reaction mixture while stirring over 60 minutes. The subsequent steps were performed in the same manner as in Synthesis Example 1 to obtain P-11.

Synthesis Example 12

77.6 g of 4,4'-oxydiphthalic acid dianhydride and 73.6 g of 3,3',4,4'-biphenyl tetracarboxylic acid dianhydride were placed into a separable flask, and then 131.2 g of 2-hydroxyethyl methacrylate (HEMA) and 400 mL of γ-butyrolactone were added to the mixture, and the mixture was stirred at room temperature, further, 81.5 g of pyridine was added to the mixture while stirring to obtain a reaction mixture.

Under room temperature, a solution obtained by dissolving 206.3 g of dicyclohexylcarbodiimide (DCC) in 180 mL of γ-butyrolactone was added to the reaction mixture while stirring over 40 minutes, and subsequently, a suspension obtained by suspending 93.0 g of 4,4'-diaminodiphenyl ether (DADPE) in 350 mL of γ-butyrolactone was added to the reaction mixture while stirring over 60 minutes. After further stirring at room temperature for two hours, 30 mL of ethyl alcohol was added and the reaction mixture was stirred for one hour, and then 400 mL of γ-butyrolactone was added. The sediment formed in the reaction mixture was removed by filtration to obtain a reaction solution. The obtained reaction solution was added to three liters of ethyl alcohol to produce a sediment consisting of crude polymer. The resulting crude polymer was separated by filtration and dissolved in 1.5 liters of tetrahydrofuran to obtain a crude polymer solution. The obtained crude polymer solution was added dropwise to 28 liters of water to sediment a polymer, and the obtained sediment was separated by filtration, and then vacuum drying was performed to obtain a powdery polymer (polyimide precursor P-12).

<Measurement of Weight-Average Molecular Weight (Mw) and Molecular Weight Dispersion>

With regard to the above-mentioned polyimide precursor, a weight-average molecular weight (Mw) and a number-average molecular weight (Mn) were measured by the following method.

Mw and Mn were defined as polystyrene equivalent values according to gel permeation chromatography (GPC measurement). Mw and Mn were measured by using HLC-8220 (manufactured by Tosoh Co., Ltd.), using GUARD COLUMN HZ-L, TSKgel Super HZM-M, TSKgel Super HZ4000, TSKgel Super HZ 3000, and TSKgel Super HZ 2000 (manufactured by Tosoh Co., Ltd) as a column, and using tetrahydrofuran (THF) as an eluent. In addition, detection was made using a detector having an ultraviolet ray (UV ray) wavelength of 254 nm.

Furthermore, molecular weight dispersion (Mw/Mn) was calculated.

<Ring Closure Rate>

A ring closure rate of polymer was obtained by analyzing an imide ring quantity for an NH signal of nuclear magnetic resonance (NMR) spectrum.

<Mass of Urea Compound in Polyimide Precursor>

A urea compound included in the polyimide precursor was analyzed qualitatively and quantitatively by NMR and liquid chromatography.

The details of the obtained polyimide precursor are shown below.

TABLE 1

| Polyimide precursor | Molar ratio of repeating unit including biphenyl structure and repeating unit including biphenyloxy structure (m1/m2) | Weight-average molecular weight | Molecular weight dispersion | Ring closure rate (%) | Amount of urea compound (mass ppm) |
|---|---|---|---|---|---|
| P-1 | 50/50 | 22000 | 1.65 | 25 | 50 |
| P-2 | 60/40 | 22000 | 1.65 | 25 | 50 |

TABLE 1-continued

| Polyimide precursor | Molar ratio of repeating unit including biphenyl structure and repeating unit including biphenyloxy structure (m1/m2) | Weight-average molecular weight | Molecular weight dispersion | Ring closure rate (%) | Amount of urea compound (mass ppm) |
|---|---|---|---|---|---|
| P-3 | 40/60 | 22000 | 1.65 | 25 | 50 |
| P-4 | 70/30 | 22000 | 1.65 | 25 | 50 |
| P-5 | 30/70 | 22000 | 1.65 | 25 | 50 |
| P-6 | 100/0 | 22000 | 1.65 | 25 | 50 |
| P-7 | 0/100 | 22000 | 1.65 | 25 | 50 |
| P-8 | 50/50 | 22000 | 1.65 | 25 | 100 |
| P-9 | 50/50 | 27000 | 1.65 | 25 | 50 |
| P-10 | 50/50 | 9000 | 1.65 | 25 | 50 |
| P-11 | 50/50 | 22000 | 2.25 | 25 | 50 |
| P-12 | 50/50 | 22000 | 1.65 | 35 | 50 |

Examples and Comparative Examples

Each component described in the following Table 2 was mixed, and a coating solution of the photosensitive resin composition was prepared as a uniform solution.

<<Composition of Photosensitive Resin Composition>>

Polyimide precursor: Part by mass of the type described in Table 2 is 100 parts by mass.

Photopolymerization initiator and sensitizing agent: Part by mass of the type described in Table 2 is part by mass indicated in Table 3 (Mass of the components is indicated with respect to 100 parts by mass of the polyimide precursor, and the following components are the same).

Crosslinking agent ((meth)acrylate): Parts by mass of the type described in Table 2 is part by mass indicated in Table 4.

Silane coupling agent: Parts by mass of the type described in Table 2 is part by mass indicated in Table 5.

Migration suppressing agent: Parts by mass of the type described in Table 2 is part by mass indicated in Table 5.

Polymerization inhibitor: Parts by mass of the type described in Table 2 is part by mass indicated in Table 5.

Solvent: Parts by mass of the type described in Table 2 is part by mass indicated in Table 5.

TABLE 2

|  | Polyimide precursor | Photopolymerization initiator | Sensitizing agent | | Crosslinking agent | Others | Content of urea in photosensitive resin composition | Evaluation of lithography performance | Evaluation of warping |
|---|---|---|---|---|---|---|---|---|---|
| Example 1 | P-1 | A-1 | A-7 | A-8 | B-1 | C-1 to C-5 | 50 | A | A |
| Example 2 | P-2 | A-1 | A-7 | A-8 | B-1 | C-1 to C-5 | 50 | A | B |
| Example 3 | P-3 | A-1 | A-7 | A-8 | B-1 | C-1 to C-5 | 50 | A | C |
| Example 4 | P-4 | A-1 | A-7 | A-8 | B-1 | C-1 to C-5 | 50 | B | B |
| Example 5 | P-5 | A-1 | A-7 | A-8 | B-1 | C-1 to C-5 | 50 | B | D |
| Example 6 | P-6 | A-1 | — | — | B-1 | C-1 to C-5 | 50 | C | B |
| Example 7 | P-6 | A-1 | A-7 | A-8 | B-1 | C-1 to C-5 | 50 | B | A |
| Example 8 | P-1 | A-3 | A-7 | A-8 | B-1 | C-1 to C-5 | 50 | B | A |
| Example 9 | P-1 | A-4 | A-7 | A-8 | B-1 | C-1 to C-5 | 50 | B | A |
| Example 10 | P-1 | A-1 | A-7 | A-8 | B-2 | C-1 to C-5 | 50 | C | D |
| Example 11 | P-1 | A-1 | A-7 | A-8 | B-3 | C-1 to C-5 | 50 | C | D |
| Example 12 | P-1 | A-1 | A-7 | A-8 | B-4 | C-1 to C-5 | 50 | D | D |
| Example 13 | P-1 | A-1/A-3 = 1/1 | A-7 | A-8 | B-1 | C-1 to C-5 | 50 | A | B |

TABLE 2-continued

| | Polyimide precursor | Photopolymerization initiator | Sensitizing agent | Crosslinking agent | Others | Content of urea in photosensitive resin composition | Evaluation of lithography performance | Evaluation of warping |
|---|---|---|---|---|---|---|---|---|
| Example 14 | P-1 | A-1/A-4 = 1/1 | A-7 | A-8 | B-1 | C-1 to C-5 | 50 | B | B |
| Example 15 | P-3 | A-1 | A-7 | A-8 | B-2 | C-1 to C-5 | 50 | C | D |
| Example 16 | P-8 | A-1 | A-7 | A-8 | B-1 | C-1 to C-5 | 1000 | D | A |
| Example 17 | P-9 | A-1 | A-7 | A-8 | B-1 | C-1 to C-5 | 50 | D | C |
| Example 18 | P-10 | A-1 | A-7 | A-8 | B-1 | C-1 to C-5 | 50 | D | C |
| Example 19 | P-11 | A-1 | A-7 | A-8 | B-1 | C-1 to C-5 | 50 | C | C |
| Example 20 | P-12 | A-1 | A-7 | A-8 | B-1 | C-1 to C-5 | 50 | C | B |
| Comparative example 1 | P-1 | A-2 | A-7 | A-8 | B-1 | C-1 to C-5 | 50 | E | B |
| Comparative example 2 | P-1 | A-2 | — | — | B-1 | C-1 to C-5 | 50 | E | B |
| Comparative example 3 | P-1 | A-5 | A-7 | A-8 | B-1 | C-1 to C-5 | 50 | E | B |
| Comparative example 4 | P-1 | A-6 | A-7 | A-8 | B-1 | C-1 to C-5 | 50 | E | B |
| Comparative example 5 | P-7 | A-1 | — | — | B-1 | C-1 to C-5 | 50 | A | E |

TABLE 3

| Symbol | Compound name | Type | Structure | Parts by mass |
|---|---|---|---|---|
| A-1 | 2-[[(Phenylcarbonyl)oxy]imino]-1-phenylpropan-1-one | Photopolymerization initiator (generating aryl radical) | Oxime-based | 4.00 |
| A-2 | 2-[[(Ethoxycarbonyl)oxy]imino]-1-phenylpropan-1-one | Photopolymerization initiator (not generating atyl radical) | Oxime-based | 4.00 |
| A-3 | 1,2-Octanedione, 1-[4-(phenylthio)-, 2-(O-benzoyloxime)] | Photopolymerization initiator (generating aryl radical) | Oxime-based | 4.00 |
| A-4 | 1-(4-Phenylsulfanyl-phenyl)-octan-1-one oxime-O-benzoate | Photopolymerization initiator (generating aryl radical) | Oxime-based | 4.00 |
| A-5 | NCI 831, manufactured by ADEKA Corporation | Photopolymerization initiator (not generating aryl radical) | Oxime-based | 4.00 |
| A-6 | 1-[9-Ethyl-6-(2-methylbenzoyl)-9H-carbazol-3-yl]-1-(O-acetyloxime) | Photopolymerization initiator (not generating aryl radical) | Oxime-based | 4.00 |
| A-7 | Ethyl 7-(diethylamino)coumarin-3-carboxylate | Sensitizing agent | Coumarin-based | 0.04 |
| A-8 | N-Phenyldiethanolamine | Sensitizing agent | Amine-based | 6.86 |

TABLE 4

| Symbol | Compound name | The number of ethylene glycol structure | Parts by mass |
|---|---|---|---|
| B-1 | Polyethylene glycol dimethacrylate | 4 to 8 mixture T1352 manufactured by Tokyo Chemical Industry Co., Ltd. | 9.70 |
| B-2 | Tetraethylene glycol dimethacrylate | 4 | 9.70 |
| B-3 | Pentaerythritol tetraacrylate | 4 | 9.70 |
| B-4 | Triethylene glycol dimethacrylate | 3 | 9.70 |

TABLE 5

| Symbol | Compound name | Type | Parts by mass |
|---|---|---|---|
| C-1 | N[3-(Triethoxysilyl)propyl] phthalamic acid | Silane coupling agent | 1.00 |
| C-2 | 1,3,5-Tris[[4-(1,1-dimethylethyl)-3-hydroxy-2,6-dimethylphenyl]methyl]-1,3,5-triazine-2,4,6(1H,3H,5H)-trione | Migration suppressing agent | 0.60 |
| C-3 | 1-Nitroso-2-naphthol | Polymerization inhibitor | 0.05 |
| C-4 | N-Methyl-2-pyrrolidone | Solvent | 128.80 |
| C-5 | Ethyl lactate | Solvent | 32.20 |

<Evaluation of Lithographic Properties>

Each photosensitive resin composition was pressure-filtered through a filter having a pore width of 0.8 μm, and then the photosensitive resin composition was coated onto a silicon wafer by a spin coating method. The silicon wafer coated with the photosensitive resin composition layer was dried at 100° C. for 5 minutes on a hot plate to form a uniform photosensitive resin composition layer with a thickness of 20 μm on the silicon wafer.

The photosensitive resin composition layer on the silicon wafer was exposed using a stepper (Nikon NSR2005 i9C). Exposure was carried out with i-ray such that the exposure was carried out using a fuse box photomask with an interval of 1 μm ranging from 5 μm to 25 μm, with the respective exposure energies of 200 to 500 mJ/cm$^2$ of every 100 mJ/cm$^2$ at a wavelength of 365 nm.

The exposed photosensitive resin composition was developed with cyclopentanone and propylene glycol monomethyl ether acetate (PGMEA) for 60 seconds.

At a bottom of the fuse box, a line width in which the silicon wafer was exposed was evaluated according to the following standard. It is indicated that the smaller the line width, the more refined metal line width can be formed in the subsequent plating step, and a preferable result is obtained. A measurement limit is 5 μm. The results are shown in Table 2. D or more is a practical level.

A: 5 μm or more and less than 8 μm
B: 8 μm or more and less than 10 μm
C: 10 μm or more and less than 12 μm
D: 12 μm or more and less than 15 μm
E: 15 μm or more <Mass of Urea Compound in Photosensitive Resin Composition>

The urea compound was analyzed quantitatively by using gas chromatography-mass spectrometry.

The results are shown in Table 2. In Table 2, quantity (mass ppm) is indicated with respect to 100 parts by mass of the polyimide precursor.

<Evaluation of Warping>

Each photosensitive resin composition was pressure-filtered through a filter having a pore width of 0.8 μm, and then the photosensitive resin composition was coated onto a silicon wafer by a spin coating method. The silicon wafer coated with the photosensitive resin composition layer was dried at 100° C. for 5 minutes on a hot plate to form a uniform photosensitive resin composition layer with a thickness of 20 μm on the silicon wafer. Next, the photosensitive resin composition layer on the silicon wafer was exposed using a stepper (Nikon NSR 2005 i9C) with an exposure energy of 500 mJ/cm$^2$ at an exposure wavelength of 365 nm (i-ray) (homogeneous irradiation of an entire-surface). The photosensitive resin composition layer of which entire surface is exposed was subjected to development treatment for 60 seconds by immersion in cyclopentanone. First, in a nitrogen atmosphere with an oxygen concentration of 20 volume ppm or lower, a substrate having the photosensitive resin composition after the development treatment was placed on a plate which can adjust a temperature, and heated from room temperature (20° C.) to the final reaching temperature of 230° C. at a heating rate of 10° C./min, which takes 21 minutes. Thereafter, the photosensitive resin composition layer was maintained at 230° C., which is the final reaching temperature of the heating step (holding temperature), for three hours. The photosensitive resin composition layer after heating for three hours in the holding step was cooled from 230° C. to room temperature at a cooling rate of 10° C./min to obtain a cured film.

With regard to the photosensitive resin composition layer (cured film) after the curing step, measurement of stress is carried out by the following method.

With regard to the silicon wafer before coating the photosensitive resin composition layer, the wafer was set to a determination device of thin-film stress and scanned with laser at room temperature to obtain blank value.

The wafer on which the photosensitive resin composition layer (cured film) is formed after a metal layer forming step and a secondary metal layer forming step was set to a determination device of thin-film stress, scanned with laser at room temperature, and then determined values were compared with the blank value which is determined before coating the photosensitive resin composition layer to measure stress from the film thickness and radius of curvature.

In a case where residual stress of the cured film is large, the warping of the substrate in the case of laminating the substrate and the cured film also becomes large. In addition, since interlayer peeling is likely to occur in the laminate of the cured film and the metal layer, low residual stress leads to a preferable result. The results are shown in Table 2. D or more is a practical level.

A: 15 MPa or more and less than 17 MPa
B: 17 MPa or more and less than 19 MPa
C: 19 MPa or more and less than 21 MPa
D: 21 MPa or more and less than 23 MPa
E: 23 MPa or more Example 100

The photosensitive resin composition of Example 1 was filtered under a pressure of 0.3 MPa through a filter having a pore width of 0.8 μm and then spin-coated (3500 rpm, 30 seconds) on a substrate having a thin copper layer on a surface thereof. The photosensitive resin composition which had been applied to the substrate was dried at 100° C. for 5 minutes and then exposed using an aligner (Karl-Suss MA150). Exposure was performed by irradiating light having the wavelength of 365 nm using a high-pressure mercury lamp. After exposure, an image was developed with cyclopentanone for 75 seconds. Subsequently, heating was performed at 180° C. for 20 minutes. In this way, an interlayer insulating film for a re-distribution layer was formed.

This interlayer insulating film for a re-distribution layer was excellent in insulating properties.

In addition, this interlayer insulating film for a re-distribution layer was used to produce a semiconductor device. As a result, it was confirmed that the semiconductor device operates without problems.

What is claimed is:
1. A photosensitive resin composition comprising:
a polyimide precursor including a repeating unit including a biphenyl structure; and
a photopolymerization initiator having an oxime structure capable of generating an aryl radical by being irradiated with light; and
wherein a content of a urea compound is 10 to 500 mass ppm with respect to 100 parts by mass of the polyimide precursor.

2. The photosensitive resin composition according to claim 1, wherein the polyimide precursor further includes a repeating unit including a biphenyloxy structure.

3. The photosensitive resin composition according to claim 2, wherein the molar ratio of the repeating unit including a biphenyl structure to the repeating unit including a biphenyloxy structure is 30:70 to 70:30.

4. The photosensitive resin composition according to claim 2, wherein the repeating unit including a biphenyl structure and the repeating unit including a biphenyloxy structure each independently includes a structure derived from a tetracarboxylic acid.

5. The photosensitive resin composition according to claim 1, further comprising:
a (meth)acrylate including -(alkyl chain-O)$_4$— structure;
a (meth)acrylate including -(alkyl chain-O)$_5$— structure; and
a (meth)acrylate including -(alkyl chain-O)$_6$— structure.

6. The photosensitive resin composition according to claim 5, wherein the alkyl chain is an ethylene chain.

7. The photosensitive resin composition according to claim 5, wherein the (meth)acrylate is a bi- or higher-functional (meth)acrylate.

8. The photosensitive resin composition according to claim 1, wherein the weight-average molecular weight of the polyimide precursor is 10000 to 25000.

9. The photosensitive resin composition according to claim 1, wherein the molecular weight dispersion of the polyimide precursor is 1.3 to 2.0.

10. The photosensitive resin composition according to claim 1, wherein the ring closure rate calculated from an NH signal of a nuclear magnetic resonance spectrum of the polyimide precursor is 20% to 30%.

11. The photosensitive resin composition according to claim 1, wherein the repeating unit including a biphenyl structure is represented by Formula (1),

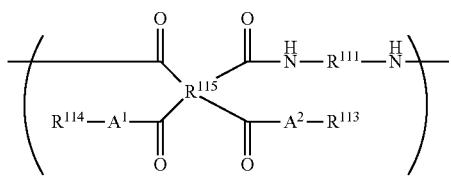

Formula (1)

in Formula (1), $A^1$ and $A^2$ each independently represents an oxygen atom or NH, $R^{111}$ represents a divalent organic group, $R^{115}$ represents a tetravalent organic group having a biphenyl skeleton, and $R^{113}$ and $R^{114}$ each independently represents a group including a radically polymerizable group.

12. The photosensitive resin composition according to claim 2, wherein the repeating unit including a biphenyloxy structure is represented by Formula (2),

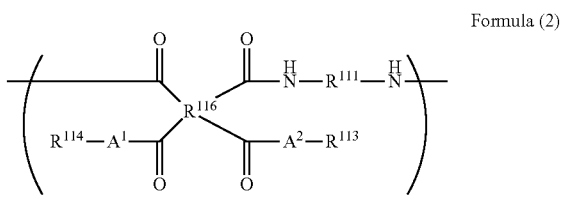

Formula (2)

in Formula (2), $A^1$ and $A^2$ each independently represents an oxygen atom or NH, $R^{111}$ represents a divalent organic group, $R^{116}$ represents a tetravalent organic group having a biphenyloxy skeleton, and $R^{113}$ and $R^{114}$ each independently represents a group including a radically polymerizable group.

13. The photosensitive resin composition according to claim 12, wherein $R^{111}$ in Formula (1) and $R^{111}$ in Formula (2) are each independently represented by —Ar-L-Ar—, where each Ar independently represents an aromatic hydrocarbon group, and L is a group selected from the group consisting of an aliphatic hydrocarbon group having 1 to 10 carbon atoms which may be substituted with a fluorine atom, —O—, —CO—, —S—, —SO$_2$—, —NHCO—, and a group obtained by combining two or more thereof.

14. The photosensitive resin composition according to claim 1, further comprising a solvent.

15. A cured film obtained by curing the photosensitive resin composition according to claim 1.

16. A laminate comprising two or more cured films according to claim 15.

17. The laminate according to claim 16, further comprising a metal layer between the cured films.

18. A method for producing a cured film, comprising the steps of:
applying the photosensitive resin composition according to claim 1 to a substrate to form a layer of the photosensitive resin composition;
exposing the photosensitive resin composition layer; and
subjecting the exposed photosensitive resin composition layer to a development treatment.

19. The method for producing a cured film according to claim 18, wherein the development treatment is a negative tone development treatment.

20. A method for producing a laminate, comprising:
forming a cured film in accordance with the method for producing a cured film according to claim 18; and then
further carrying out the forming, the exposing, and the subjecting, in this order, 2 to 5 times.

21. A semiconductor device comprising the cured film according to claim 15.

* * * * *